United States Patent
Simsek-Ege et al.

(10) Patent No.: US 12,302,585 B2
(45) Date of Patent: May 13, 2025

(54) MEMORY DEVICE ASSEMBLY WITH A LEAKER DEVICE

(71) Applicant: Micron Technology, Inc., Boise, ID (US)

(72) Inventors: Fatma Arzum Simsek-Ege, Boise, ID (US); Ashonita A. Chavan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 17/805,586

(22) Filed: Jun. 6, 2022

(65) Prior Publication Data

US 2023/0397433 A1    Dec. 7, 2023

Related U.S. Application Data

(60) Provisional application No. 63/365,640, filed on Jun. 1, 2022.

(51) Int. Cl.
| | |
|---|---|
| H10B 53/30 | (2023.01) |
| H10B 51/10 | (2023.01) |
| H10B 51/30 | (2023.01) |
| H10B 53/10 | (2023.01) |

(52) U.S. Cl.
CPC ............. *H10B 53/30* (2023.02); *H10B 51/30* (2023.02); *H10B 51/10* (2023.02); *H10B 53/10* (2023.02)

(58) Field of Classification Search
CPC ........ H10B 51/10; H10B 51/20; H10B 51/30; H10B 53/10; H10B 53/20; H10B 53/30
See application file for complete search history.

(56) References Cited

U.S. PATENT DOCUMENTS

| | | | |
|---|---|---|---|
| 2019/0189357 A1* | 6/2019 | Chavan | H01G 4/33 |
| 2020/0235111 A1* | 7/2020 | Calderoni | H01G 4/008 |
| 2021/0134816 A1* | 5/2021 | Calderoni | G11C 11/221 |
| 2023/0014289 A1* | 1/2023 | Servalli | H01L 29/78642 |
| 2023/0027308 A1* | 1/2023 | Ramaswamy | H10B 53/30 |
| 2023/0380139 A1* | 11/2023 | Sakui | G11C 16/04 |
| 2023/0397434 A1* | 12/2023 | Mariani | H10B 53/10 |

FOREIGN PATENT DOCUMENTS

JP    2004288710 A  * 10/2004  ............. H01L 28/91

* cited by examiner

*Primary Examiner* — Matthew E Warren
(74) *Attorney, Agent, or Firm* — Harrity & Harrity, LLP

(57) ABSTRACT

Implementations described herein relate to various structures, integrated assemblies, and memory devices. In some implementations, a memory device includes multiple memory cells. Each memory cell may include a bottom electrode having an open top cylinder shape that contains a support pillar, may include a top electrode, may include an insulator that separates the top electrode from the bottom electrode, and may include a leaker device having an open top cylinder shape. A bottom surface of the leaker device may abut at least one of a top surface of the bottom electrode or a top surface of the support pillar. A top surface of the leaker device may abut a bottom surface of a conductive plate. The memory device may also include the conductive plate.

24 Claims, 35 Drawing Sheets

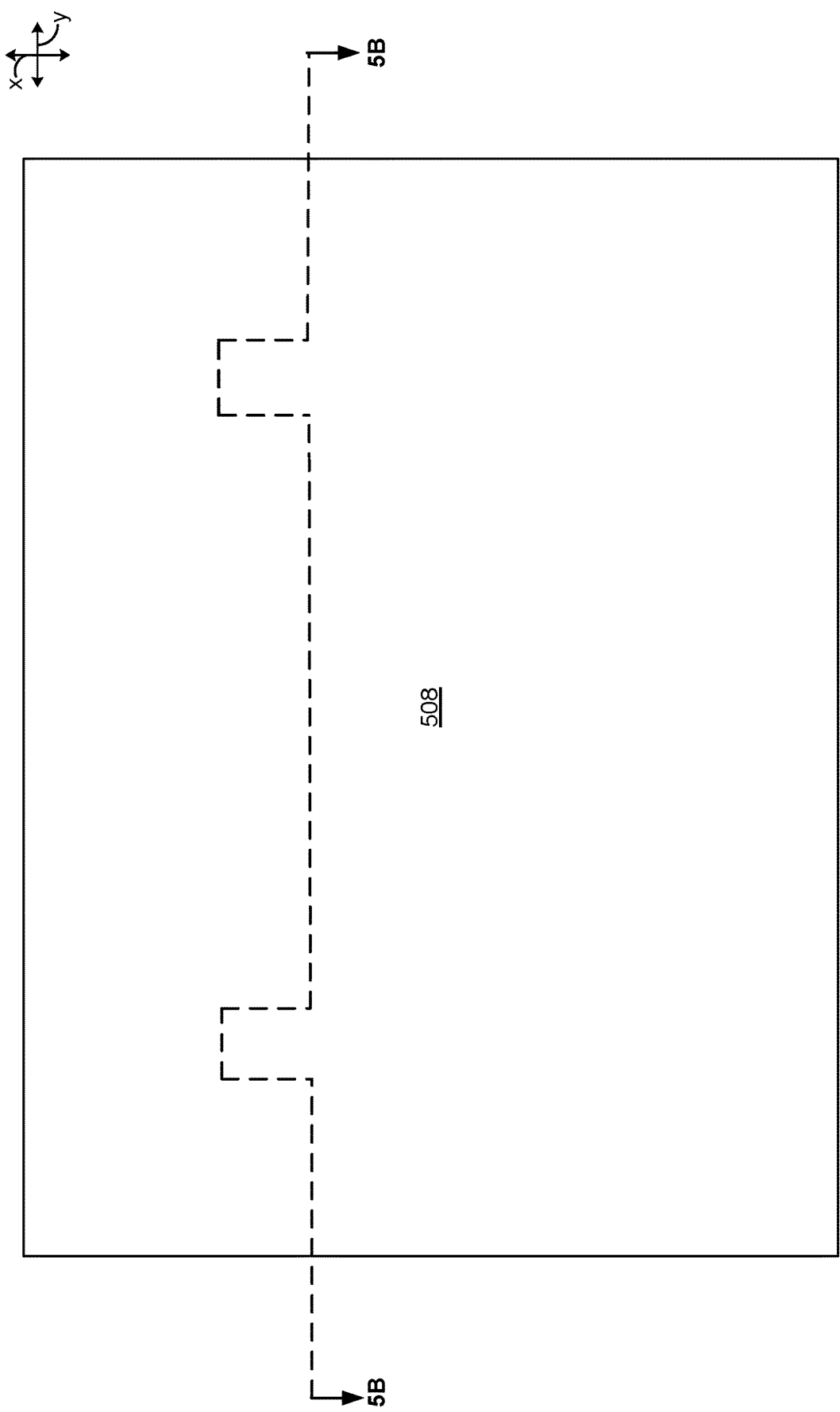

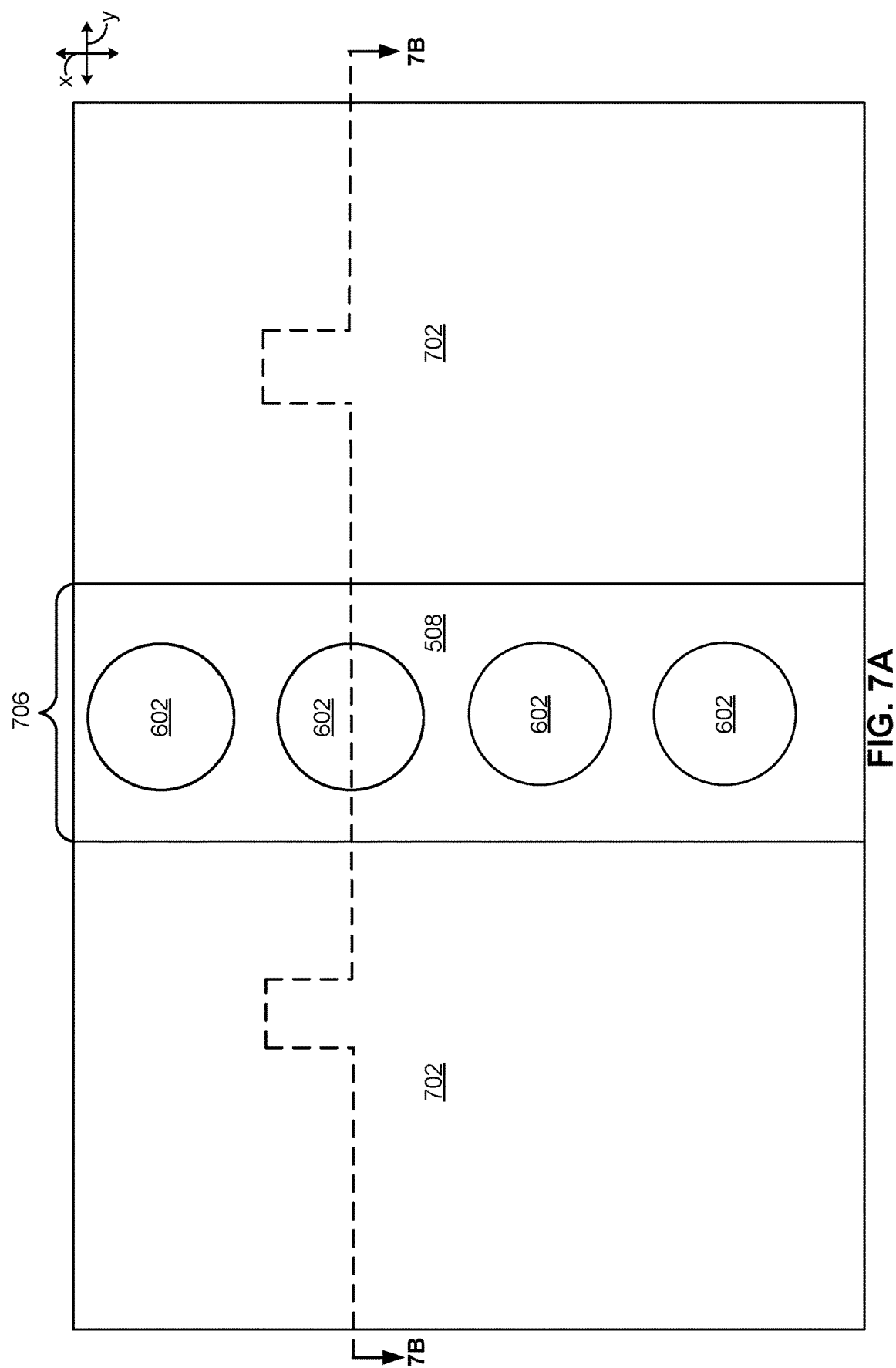

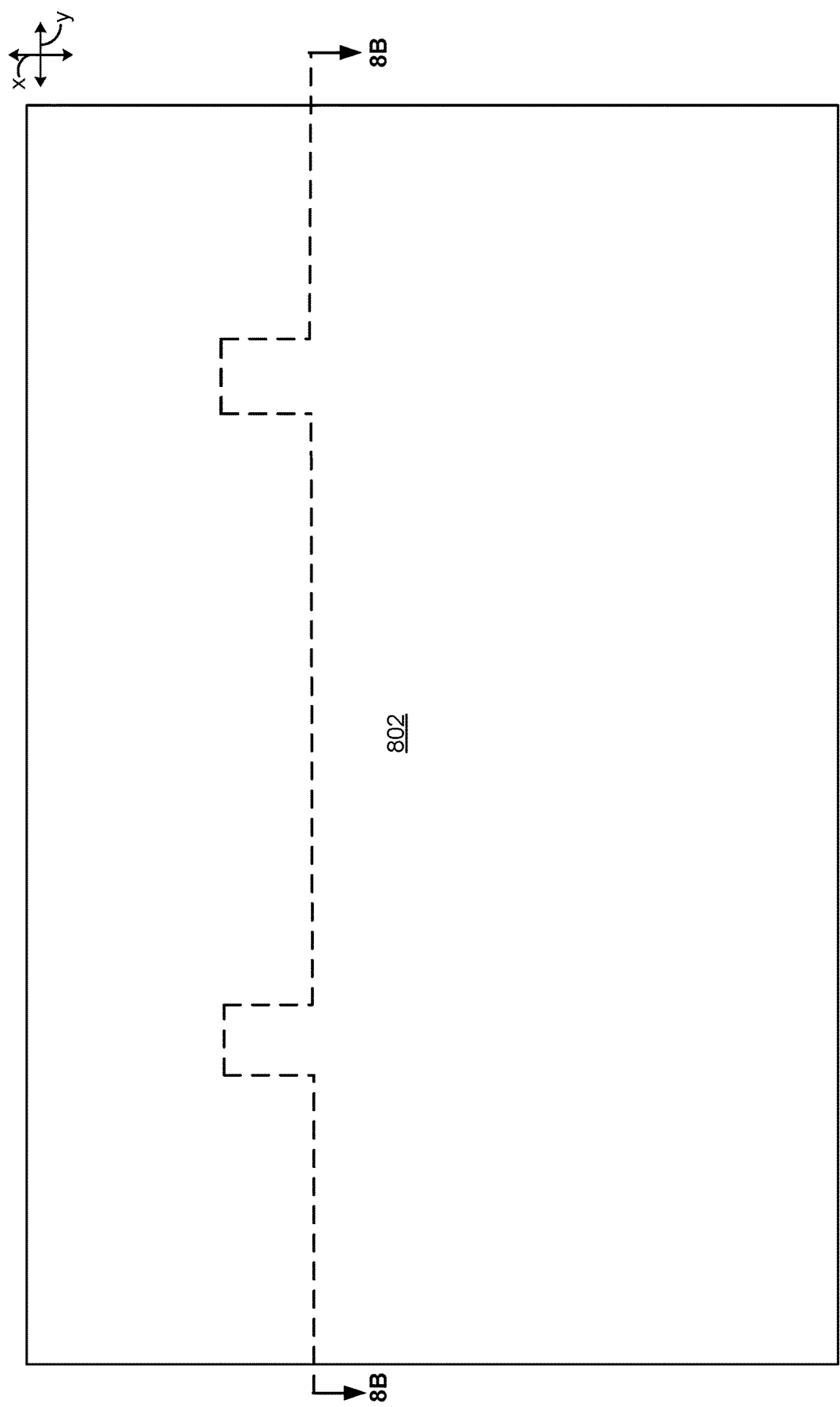

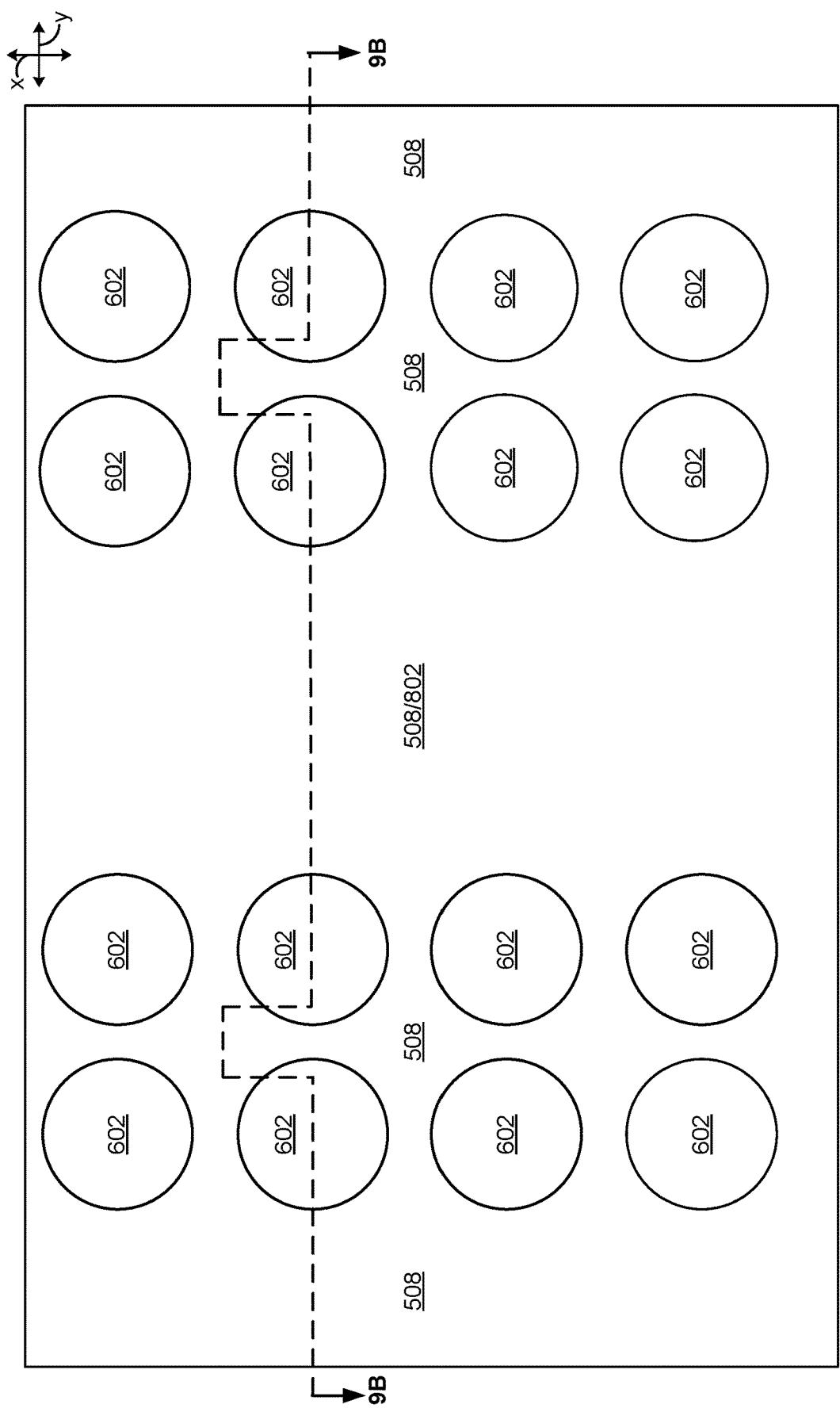

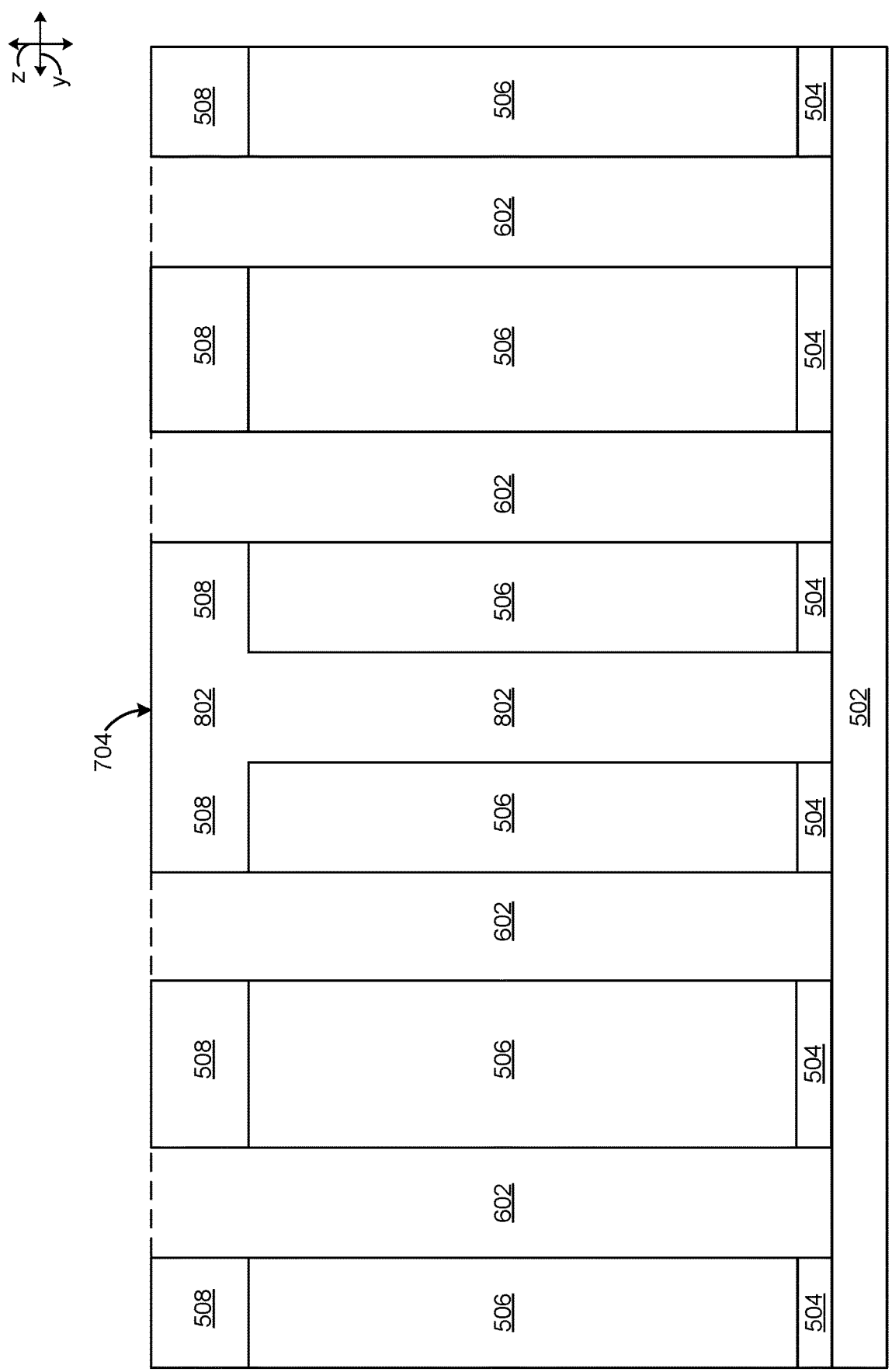

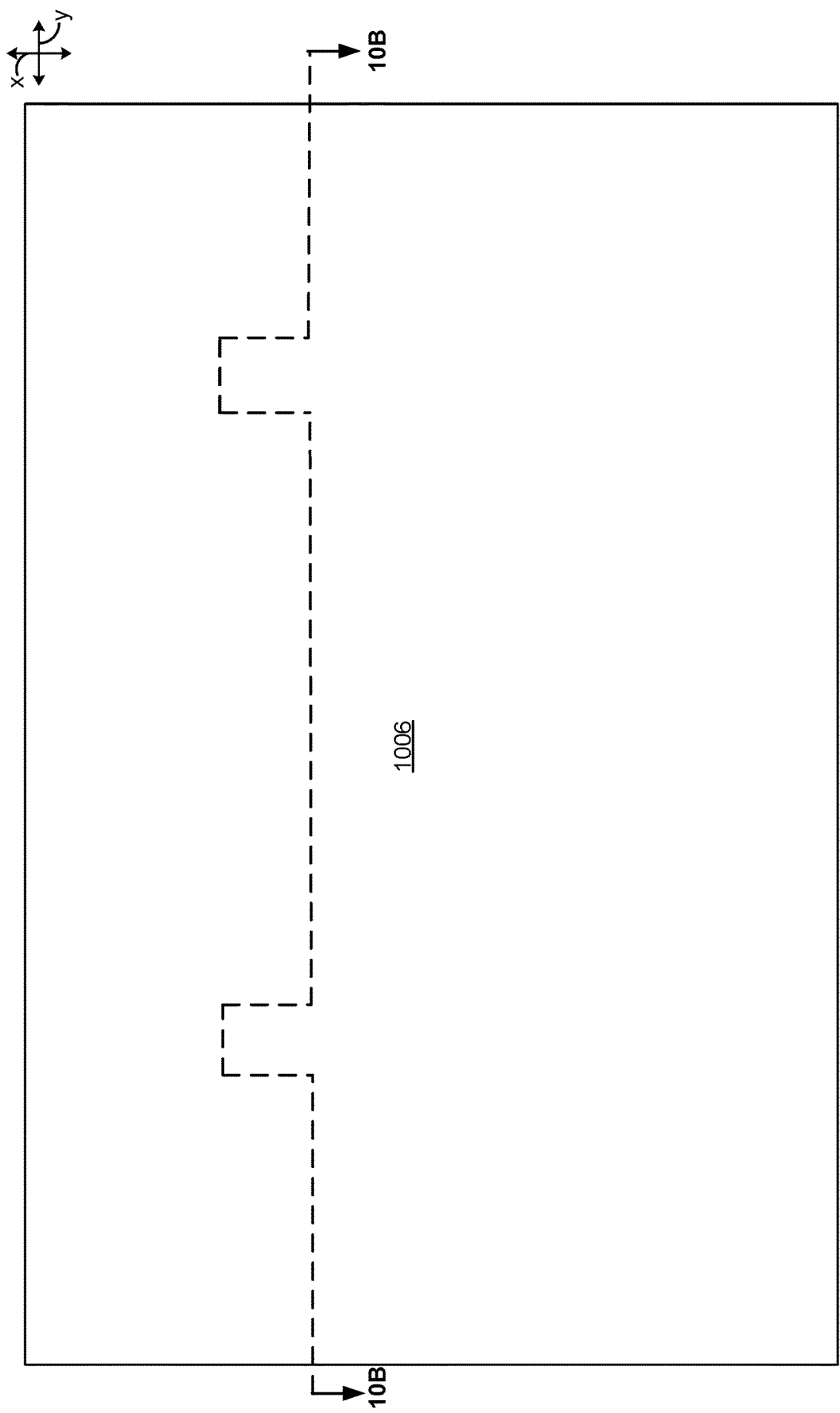

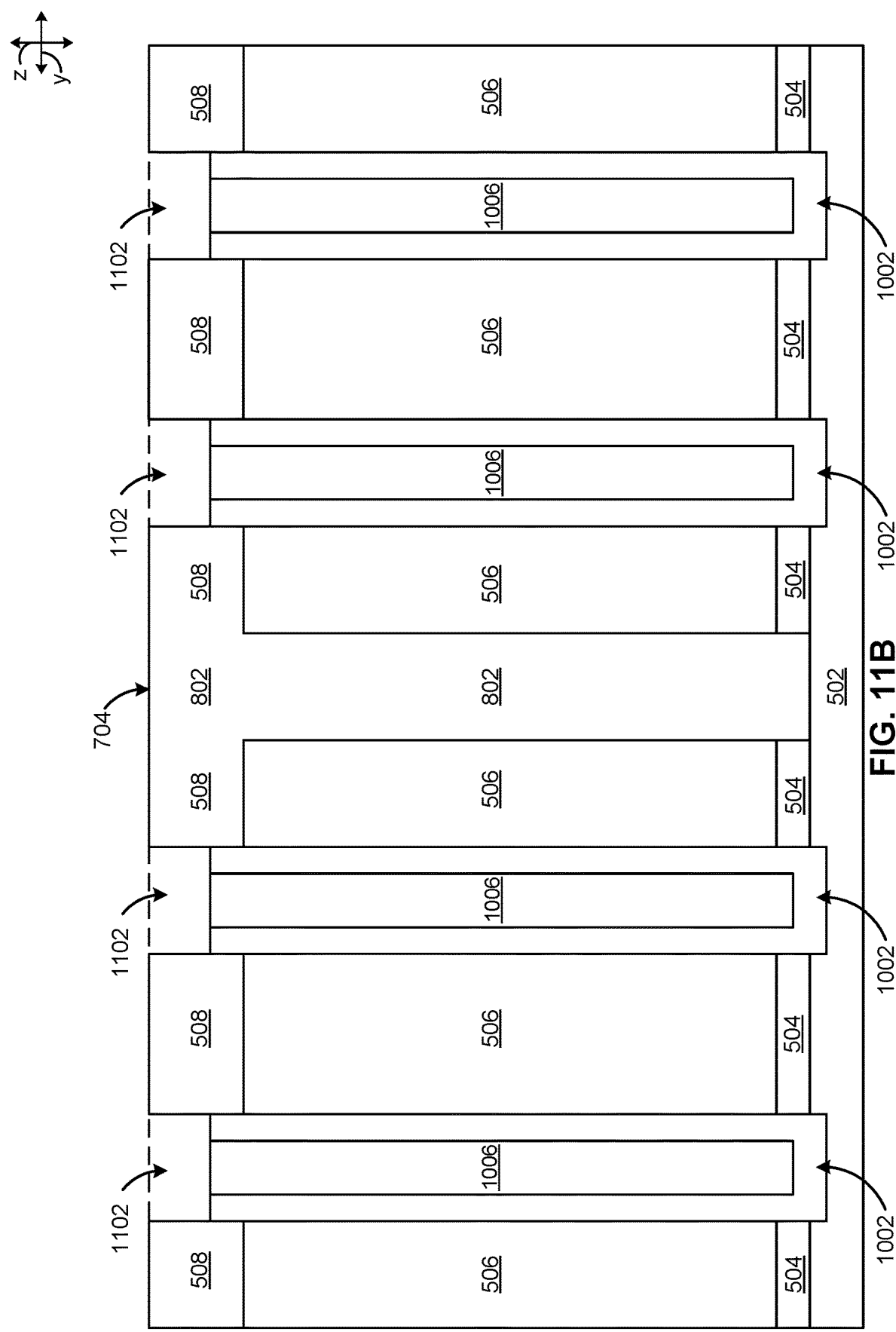

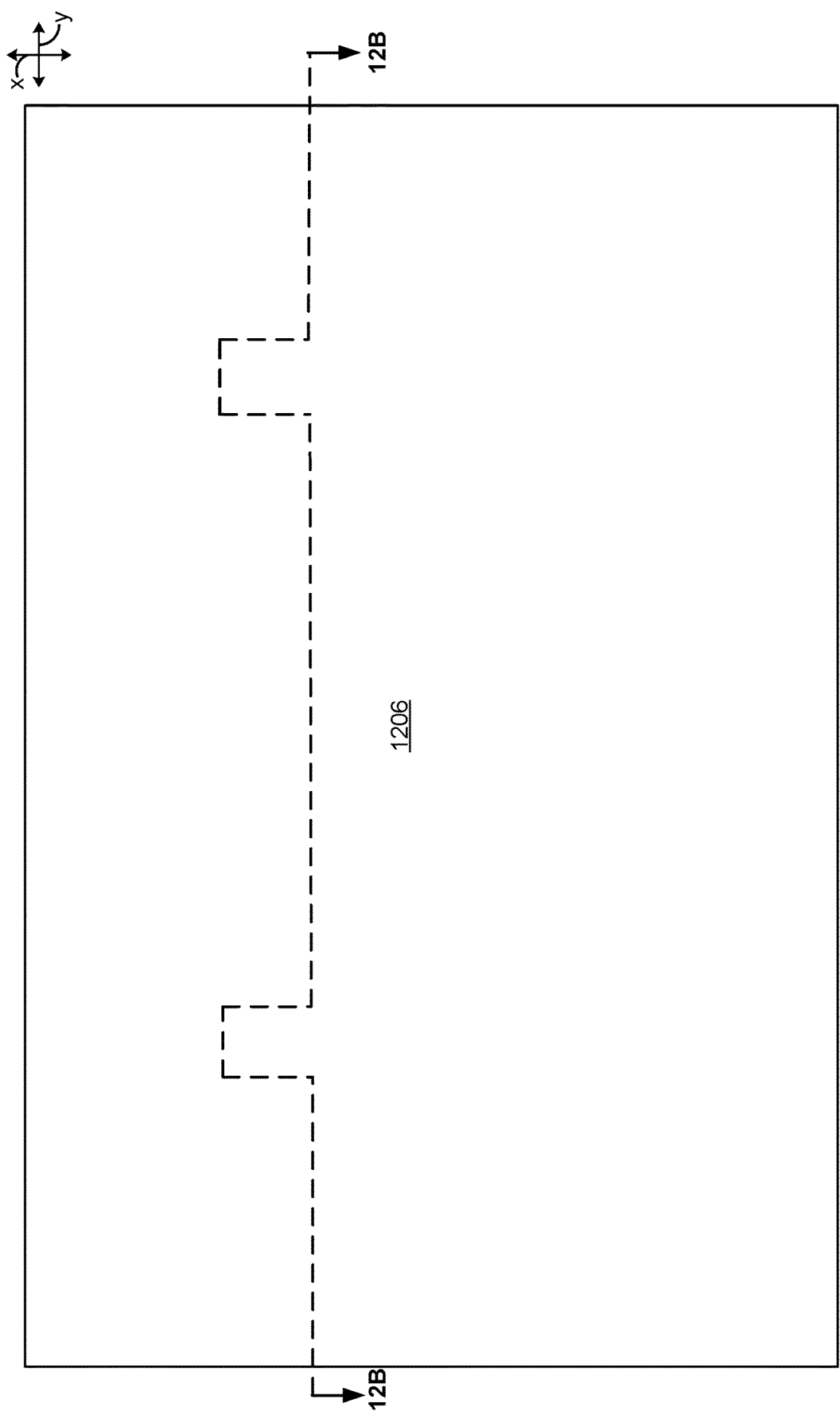

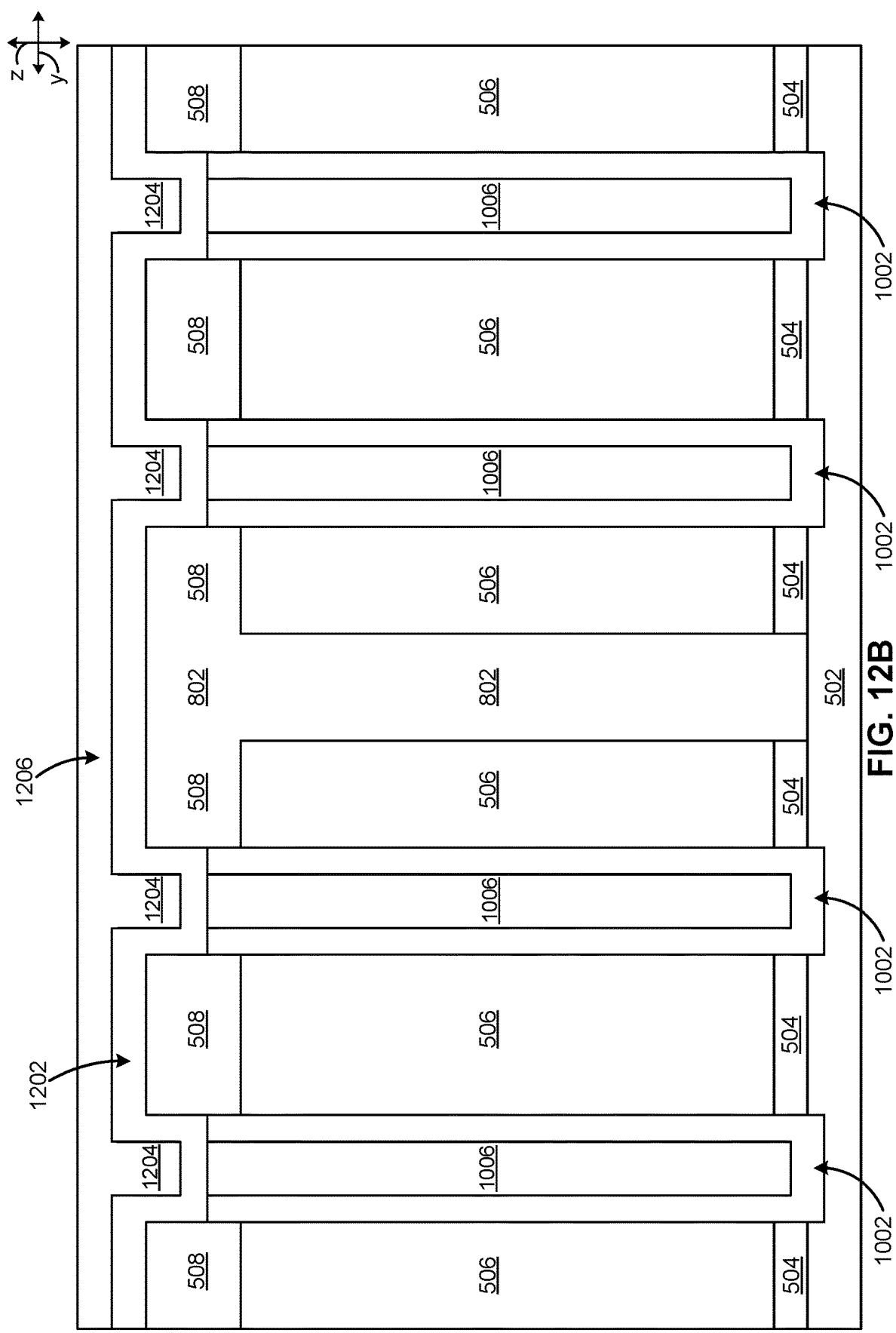

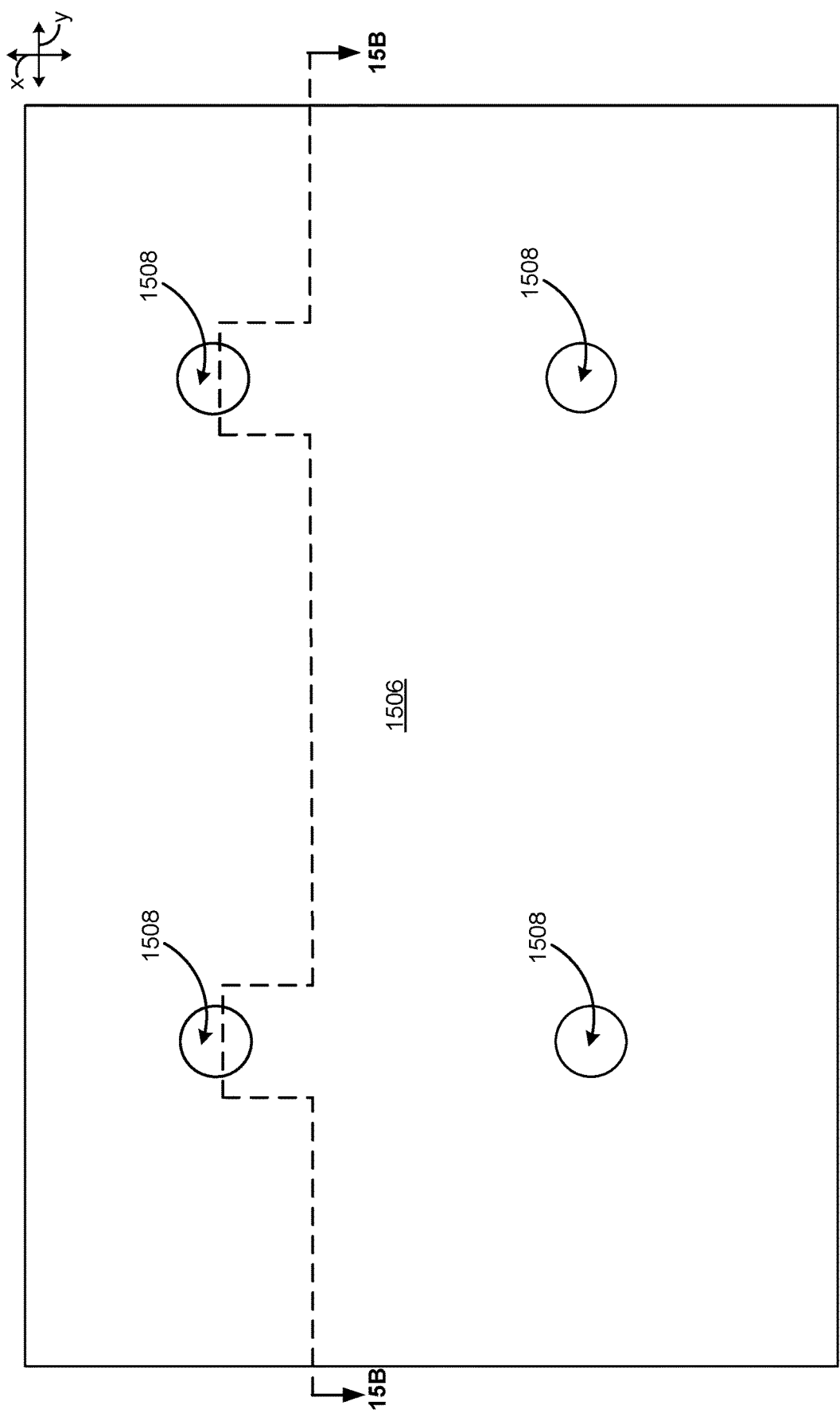

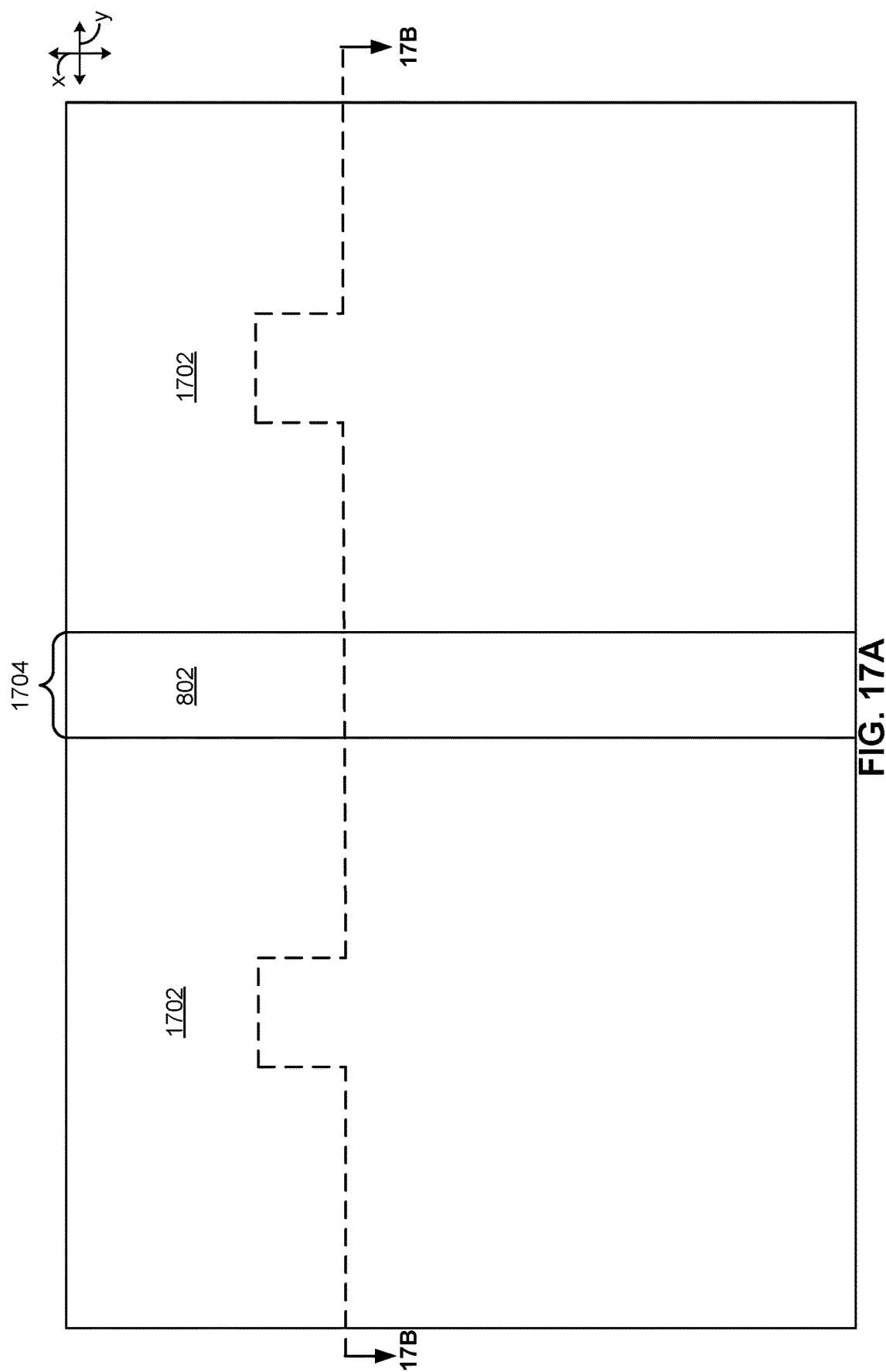

MEMORY DEVICE ASSEMBLY WITH A LEAKER DEVICE

CROSS-REFERENCE TO RELATED APPLICATION

This Patent Application claims priority to Provisional Patent Application No. 63/365,640, filed on Jun. 1, 2022, and entitled "MEMORY DEVICE ASSEMBLY WITH A LEAKER DEVICE." The disclosure of the prior application is considered part of and is incorporated by reference into this patent application.

TECHNICAL FIELD

The present disclosure generally relates to semiconductor devices and methods of forming semiconductor devices. For example, the present disclosure relates to a memory device assembly with a leaker device.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source. A binary memory device may, for example, include a charged or discharged capacitor. A charged capacitor may, however, become discharged over time through leakage currents, resulting in the loss of the stored information. Some features of volatile memory may offer advantages, such as faster read or write speeds, while some features of non-volatile memory, such as the ability to store data without periodic refreshing, may be advantageous.

FeRAM may use similar device architectures as volatile memory but may have non-volatile properties due to the use of a ferroelectric capacitor as a storage device. For example, FeRAM has advantages of faster write speeds and endurance for repeated memory access with lower power consumption than other types of non-volatile memory. FeRAM can provide non-volatile functionality comparable to that of flash memory with a speed and architecture comparable to that of dynamic random access memory (DRAM). Thus, FeRAM devices may have improved performance compared to other types of non-volatile memory and/or volatile memory.

BRIEF DESCRIPTION OF THE DRAWINGS

FIG. 3A is a top view, FIG. 3B is a cross-sectional view along the line 3B-3B of FIG. 3A, FIG. 3C is a cross-sectional view along the line 3C-3C of FIG. 3B, FIG. 3D is a cross-sectional view along the line 3D-3D of FIG. 3B, and FIG. 3E is a cross-sectional view along the line 3B-3B extended further in the illustrated y-direction.

FIGS. 5A and 5B are diagrammatic views showing formation of the structure of FIGS. 3A-3E at an example process stage of an example process of forming the structure.

FIG. 5A is a top view, and FIG. 5B is a cross-sectional view along the line 5B-5B of FIG. 5A.

FIG. 6A is a top view, and FIG. 6B is a cross-sectional view along the line 6B-6B of FIG. 6A.

FIGS. 7A and 7B are diagrammatic views showing formation of the structure of FIGS. 3A-3E at an example process stage that is after the example process stage of FIGS. 6A and 6B. FIG. 7A is a top view, and FIG. 7B is a cross-sectional view along the line 7B-7B of FIG. 7A.

FIGS. 8A and 8B are diagrammatic views showing formation of the structure of FIGS. 3A-3E at an example process stage that is after the example process stage of FIGS. 7A and 7B. FIG. 8A is a top view, and FIG. 8B is a cross-sectional view along the line 8B-8B of FIG. 8A.

FIGS. 9A and 9B are diagrammatic views showing formation of the structure of FIGS. 3A-3E at an example process stage that is after the example process stage of FIGS. 8A and 8B. FIG. 9A is a top view, and FIG. 9B is a cross-sectional view along the line 9B-9B of FIG. 9A.

FIGS. 10A and 10B are diagrammatic views showing formation of the structure of FIGS. 3A-3E at an example process stage that is after the example process stage of FIGS. 9A and 9B. FIG. 10A is a top view, and FIG. 10B is a cross-sectional view along the line 10B-10B of FIG. 10A.

FIGS. 11A and 11B are diagrammatic views showing formation of the structure of FIGS. 3A-3E at an example process stage that is after the example process stage of FIGS. 10A and 10B. FIG. 11A is a top view, and FIG. 11B is a cross-sectional view along the line 11B-11B of FIG. 11A.

FIGS. 12A and 12B are diagrammatic views showing formation of the structure of FIGS. 3A-3E at an example process stage that is after the example process stage of FIGS. 11A and 11B. FIG. 12A is a top view, and FIG. 12B is a cross-sectional view along the line 12B-12B of FIG. 12A.

FIG. 13A is a top view, and FIG. 13B is a cross-sectional view along the line 13B-13B of FIG. 13A.

FIG. 14A is a top view, and FIG. 14B is a cross-sectional view along the line 14B-14B of FIG. 14A.

FIGS. 15A and 15B are diagrammatic views showing formation of the structure of FIGS. 3A-3E at an example process stage that is after the example process stage of FIGS.

14A and 14B. FIG. 15A is a top view, and FIG. 15B is a cross-sectional view along the line 15B-15B of FIG. 15A.

FIG. 16A is a top view, and FIG. 16B is a cross-sectional view along the line 16B-16B of FIG. 16A.

FIGS. 17A and 17B are diagrammatic views showing formation of the structure of FIGS. 3A-3E at an example process stage that is after the example process stage of FIGS. 16A and 16B. FIG. 17A is a top view, and FIG. 17B is a cross-sectional view along the line 17B-17B of FIG. 17A.

DETAILED DESCRIPTION

Read disturb errors in memory cells can occur due to the accumulation of excess charge within a memory cell. For example, excess charge may accumulate at a bottom electrode of a capacitor included in the memory cell. Such accumulation may occur in FeRAM or other types of memory devices as a result of, for example, plate glitch, access transistor leakage, interactions among memory cells, and/or other factors.

Some implementations described herein use leaker devices to dissipate excess charge that has accumulated at bottom electrodes of capacitors in memory cells. Furthermore, some implementations described herein enable a leaker device to be integrated into a memory cell in a manner that enables a reduced pitch (e.g., a spacing between consecutive memory cells) as compared to other leaker device configurations and/or memory cell configurations. This increases the number of memory cells that can be formed in a given area, reduces a die size, and increases the number of dies that can be manufactured from a wafer of a given size.

Figure 1:
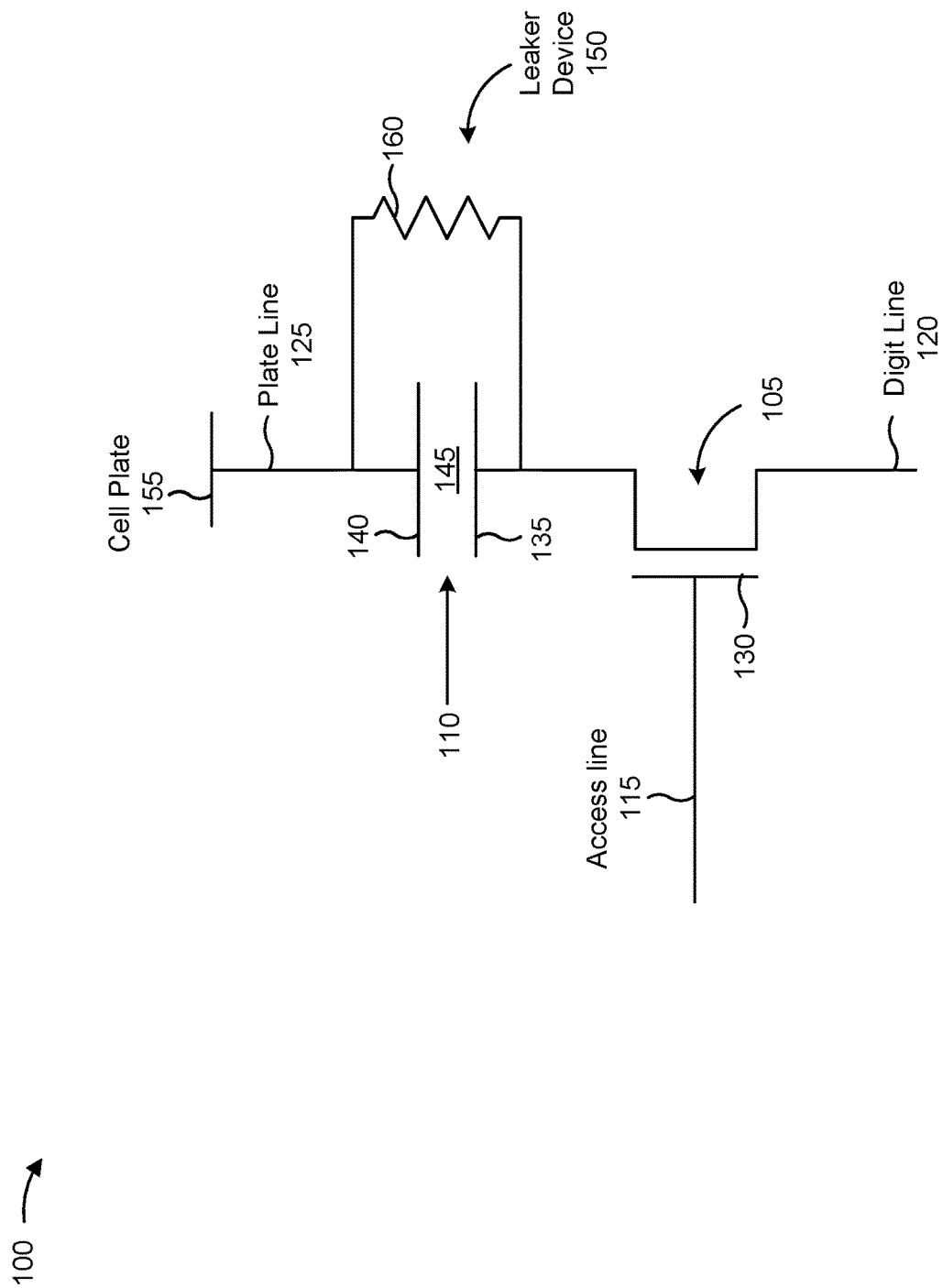
FIG. 1 is a circuit diagram of an example memory cell.

FIG. 1 is a circuit diagram of an example memory cell 100. In some implementations, the memory cell 100 is a ferroelectric memory cell. As shown in FIG. 1, the memory cell 100 may include a selection circuit 105 and a capacitor 110. The memory cell 100 may be accessed (e.g., written to, read from, and/or erased) using signals on a combination of lines that are coupled to the memory cell 100, shown as an access line 115 (sometimes called a "word line"), a digit line 120 (sometimes called a "bit line"), and a plate line 125.

The selection circuit 105 may include a transistor (sometimes called an access transistor) that includes a gate 130. The capacitor 110 includes a bottom electrode 135 and a top electrode 140 separated by an insulator 145. In some implementations, the capacitor is a ferroelectric capacitor, and the insulator 145 is a ferroelectric insulator that comprises, consists of, or consists essentially of ferroelectric material. When the access line 115 is activated (e.g., when a voltage is applied to the access line 115), the gate 130 coupled to the access line 115 may be activated. When the gate 130 is activated, the selection circuit 105 couples the digit line 120 to the bottom electrode 135 of the capacitor 110. A state of the memory cell 100 may then be written or read via the digit line 120.

The top electrode 140 of the capacitor 110 may be coupled to the plate line 125 (and a cell plate 155). To write to (or program) the memory cell 100, the access line 115 may be activated, and a voltage may be applied across the capacitor 110 by controlling the voltage of the top electrode 140 (via the plate line 125 and/or the cell plate 155) and/or the bottom electrode 135 (via the digit line 120). The applied voltage creates an electric field, and the atoms in the ferroelectric material of the insulator 145 respond to the electric field to become arranged in a particular state (e.g., a particular orientation or polarization), which is representative of a data state (e.g., a logic "0" state or a logic "1" state). In some implementations, data may be stored using the capacitor 110 by controlling a voltage difference and/or a polarity difference of the capacitor 110 (e.g., of the insulator 145 between the bottom electrode 135 and the top electrode 140). For example, a voltage of the cell plate 155 and a digit line 120 may be controlled. In some implementations, a negative polarity of the insulator 145 as compared to the cell plate 155 results in a logic "0" state being stored in the capacitor 110, and a positive polarity of the insulator 145 as compared to the cell plate 155 results in a logic "1" state being stored in the capacitor 110.

To read the memory cell 100 (e.g., a state stored by the capacitor 110), the access line 115 may be activated, and a voltage may be applied to the plate line 125. Applying a voltage to the plate line 125 may cause a change in the stored charge on the capacitor 110. The magnitude of the change in stored charge may depend on the stored state of capacitor 110 (e.g., whether the stored state is a logic "1" state or a logic "0" state). This may or may not induce a threshold change in the voltage of the digit line 120 based on the charge stored on the capacitor 110. The change in voltage or lack of change in voltage of the digit line 120 (or a magnitude of the change in voltage) may be used to determine the stored state of the capacitor 110. For example, if the change in voltage satisfies a threshold, then the read operation indicates that a first state was stored in the capacitor 110, whereas if the change in voltage does not satisfy the threshold, then the read operation determines that a second state was stored in the capacitor 110.

In some cases, excess charge may build up or accumulate at the bottom electrode 135 of the memory cell 100, which may disrupt or disturb the reading of the stored state of the memory cell 100, and in some cases may cause incorrect data to be read from the memory cell 100. This excess charge buildup is sometimes called a memory cell disturbance, and a resulting read of the memory cell 100 affected by a memory cell disturbance is sometimes called a read disturbance.

As an example, excess charge may accumulate at the bottom electrode 135 of a memory cell 100 when the memory cell 100 is not accessed (e.g., the access line 115 and the gate 130 are deactivated), but one or more other memory cells coupled to the digit line 120 are accessed. When the accessed memory cells are read, the voltage applied to the plate line(s) 125 coupled to the accessed memory cells causes a corresponding voltage on the digit line 120 because the capacitors of the accessed memory cells discharge the plate line voltage through the gates of the accessed memory cells to the digit line 120. If the non-accessed memory cell 100 is coupled to a leaky selection circuit 105 (e.g., a leaky transistor), then the voltage on the digit line 120 may leak through the selection circuit 105 to the bottom electrode 135 of the non-accessed memory cell 100. Repeated accesses to memory cells that share the digit line 120 with the non-accessed memory cell 100 may cause further accumulation in charge on the bottom electrode 135 of the non-accessed memory cell 100. As a result, reading of the memory cell 100 becomes less reliable, and the capacitor 110 may even become depolarized from an intended (e.g., programmed) state.

Some implementations described herein use a leaker device 150 to dissipate excess charge from the bottom electrode 135. The leaker device 150 may couple the bottom electrode to a cell plate 155. The leaker device 150 may include a resistor 160 configured with appropriate resistance to discharge excess charge from the bottom electrode 135 to the cell plate 155 without discharging too much charge from the bottom electrode 135 (e.g., such that the capacitor 110 can maintain an appropriate charge to store correct data). Furthermore, some implementations described herein enable the leaker device 150 to be integrated into a memory cell in a manner that enables a reduced pitch (e.g., a spacing between consecutive memory cells) as compared to other leaker device configurations. This increases the number of memory cells that can be formed in a given area, reduces a die size, and increases the number of dies that can be manufactured from a wafer of a given size.

As indicated above, FIG. 1 is provided as an example. Other examples may differ from what is described with respect to FIG. 1.

Figure 2:
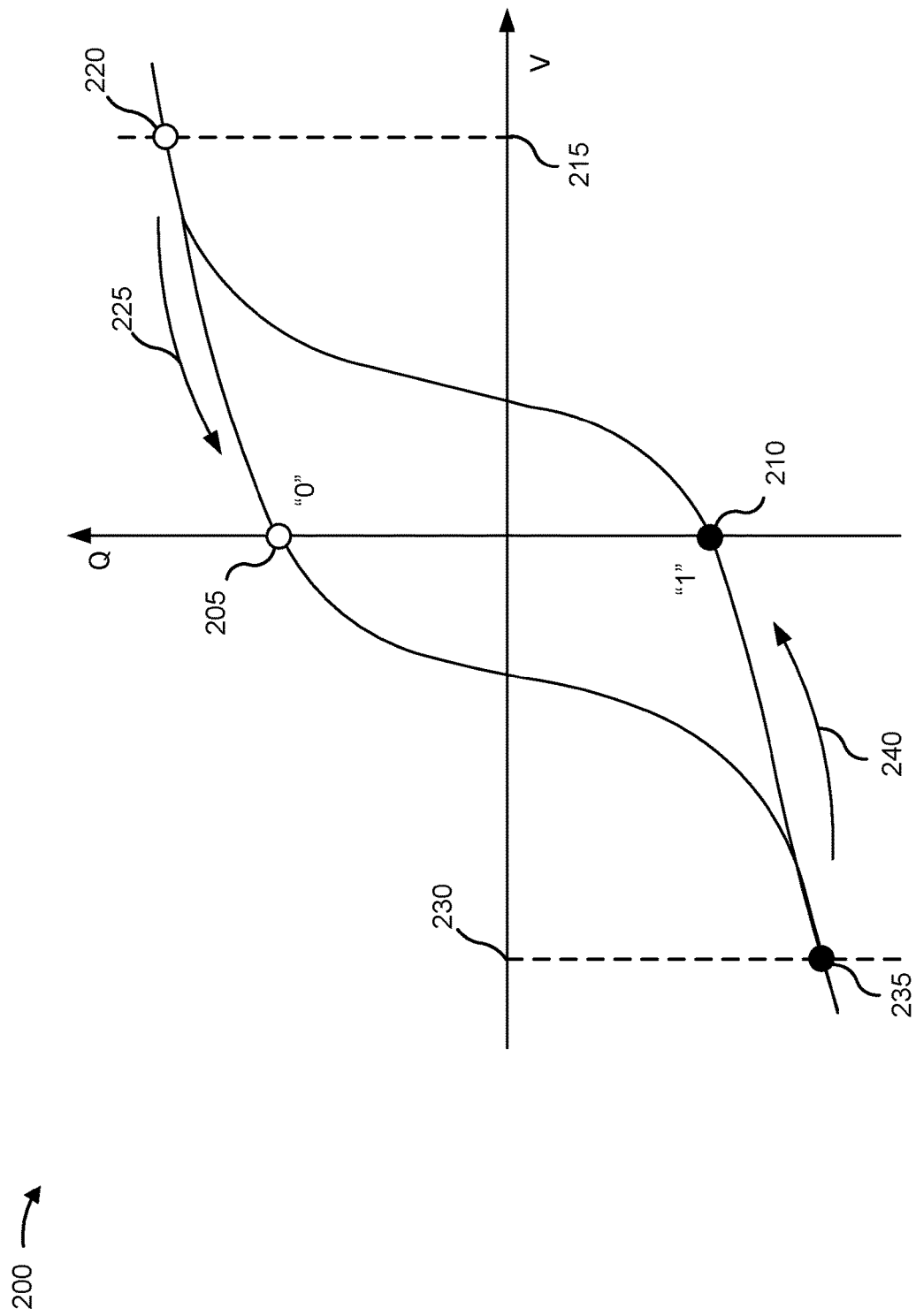
FIG. 2 is a diagram illustrating an example of electrical properties of ferroelectric materials.

FIG. 2 is a diagram illustrating an example 200 of electrical properties of ferroelectric material. The example 200 shows an example hysteresis curve for a ferroelectric material. The hysteresis curve shows a charge (Q) stored on a capacitor (e.g., capacitor 110) as a function of a voltage difference (V) across the capacitor 110 (e.g., across the bottom electrode 135 and the top electrode 140).

A ferroelectric material is characterized by spontaneous electric polarization that can be reversed by the application of an external electric field. A ferroelectric material maintains a non-zero electric polarization in the absence of an external electric field. In contrast, a linear dielectric material or a paraelectric material exhibits polarization only in the presence of an electric field. Electric polarization within a ferroelectric capacitor 110 (e.g., within the ferroelectric material of the insulator 145) results in a charge, at surfaces of the ferroelectric material, that attracts opposite charges from the capacitor electrodes. Thus, charge is stored at the interface of the insulator 145 and the bottom electrode 135, and charge is stored at the interface of the insulator 145 and the top electrode 140.

As shown in FIG. 2, the ferroelectric material may maintain a positive or negative charge with a zero voltage difference across the capacitor 110, resulting in two possible charge states: charge state 205 and charge state 210. In the example 200 of FIG. 2, charge state 205 represents a logic "0" state, and charge state 210 represents a logic "1" state. In some examples, the logic values of the respective charge states may be reversed.

A logic "0" or a logic "1" may be written to the memory cell 100 by controlling the electric polarization of the insulator 145, and thus the charge on the capacitor electrodes 135 and 140, by applying a voltage across the capacitor 110. For example, applying a positive voltage 215 across the capacitor 110 results in positive charge accumulation until charge state 220 is reached. As the positive voltage 215 is removed, the charge state of the insulator 145 changes from charge state 220 to charge state 205 (e.g., along the path 225), which is reached at zero volts and represents a logic "0" state. Similarly, applying a negative voltage 230 across the capacitor 110 results in negative charge accumulation until charge state 235 is reached. As the negative voltage 230 is removed, the charge state of the insulator 145 changes from charge state 235 to charge state 210 (e.g., along the path 240), which is reached at zero volts and represents a logic "1" state. Charge states 205 and 210 may also be referred to as the remnant polarization (Pr) values, which is the remaining polarization (and thus the charge) upon removing the external bias (e.g., voltage).

As indicated above, FIG. 2 is provided as an example. Other examples may differ from what is described with respect to FIG. 2.

FIGS. 3A-3E are diagrammatic views of an example structure 300. The structure 300 may be part of an integrated assembly, such as a memory array, a portion of a memory array, or a memory device that includes the memory array and one or more other components (e.g., sense amplifiers, a row decoder, a column decoder, a row address buffer, a column address buffer, one or more data buffers, one or more clocks, one or more counters, and/or a memory controller).

As shown in FIGS. 3A-3E, the structure 300 includes multiple pillars 302 and multiple structures 304. A pillar 302 (e.g., each pillar 302) includes a support pillar 306 and a bottom electrode 308. A structure 304 includes an insulator 310, a top electrode 312, and a fill material 314. A leaker device 316 is above the pillar 302. The leaker device 316 may be part of a pillar 318 that includes the leaker device 316 and support material 320. The pillar 318 is above the pillar 302. As shown, the structure 300 may include a substrate 322, an insulative material 324, a separation structure 326, and multiple conductive plates 328. A leaker device 316 couples a bottom electrode 308 to a conductive plate 328. The leaker device 316 may be configured to discharge excess charge from the bottom electrode 308 to the conductive plate 328.

The pillar 302 may be called a bottom electrode pillar 302 because the pillar 302 includes the bottom electrode 308. The structure 304 may be called a top electrode structure 304 because the structure 304 includes the top electrode 312. The pillar 318 may be called a leaker device pillar 318 because the pillar 318 includes the leaker device 316. The bottom electrode 308 may be called a first electrode or a lower electrode. The top electrode 312 may be called a second electrode or an upper electrode. The conductive plate 328 may be called a cell plate.

The support pillar 306 has a top surface 330, a bottom surface 332, and a circumferential surface 334. In some implementations, the shape of the support pillar 306 is a cylinder (within reasonable tolerances of manufacturing and measurement). In other words, the support pillar 306 may be substantially cylindrical in shape. In this case, the top surface 330 is a top horizontal surface of the cylinder (e.g., having a circular shape), the bottom surface 332 is the bottom horizontal surface of the cylinder (e.g., having a circular shape), and the circumferential surface 334 is the vertical surface of the cylinder (e.g., having a tube shape that connects the circular shapes on either end). The circumferential surface 334 extends vertically from the top surface 330 to the bottom surface 332 along the entire circumference of the cylinder.

The support pillar 306 may be an electrical insulator, an electrical conductor, or a semiconductor, and may comprise, consist of, or consist essentially of insulative material, conductive material, or semiconductive material. For example, the support pillar 306 may comprise, consist of, or consist essentially of titanium silicon nitride, silicon nitride, silicon dioxide, and/or silicon (e.g., polycrystalline silicon).

The bottom electrode 308 has a top surface 336, a bottom surface 338, an interior circumferential surface 340, and an exterior circumferential surface 342. In some implementations, the shape of the bottom electrode 308 is an open top cylinder (within reasonable tolerances of manufacturing and measurement). An open top cylinder is a cylinder with one open end (e.g., the top end) and one closed end (e.g., the bottom end), and can be thought of as having the shape of a container or cup. In this case, the top surface 336 is a top horizontal surface of the open top cylinder (e.g., having a ring shape or an annular shape), the bottom surface 338 is the bottom horizontal surface of the open top cylinder (e.g., having a circular shape), the interior circumferential surface 340 is the interior vertical surface of the open top cylinder (e.g., having a tube shape that forms an interior wall of the open top cylinder), and the exterior circumferential surface 342 is the exterior vertical surface of the open top cylinder (e.g., having a tube shape that forms an exterior wall of the open top cylinder). The interior circumferential surface 340 extends vertically from the bottom surface 332 of the support pillar 306 to the top surface 336 of the bottom electrode 308 along the entire circumference of the smaller concentric circle of the annulus that forms the top surface 336. The exterior circumferential surface 342 extends vertically from the bottom surface 338 of the bottom electrode 308 to the top surface 336 of the bottom electrode 308 along the entire circumference of the larger concentric circle of the annulus that forms the top surface 336.

Figure 3A:
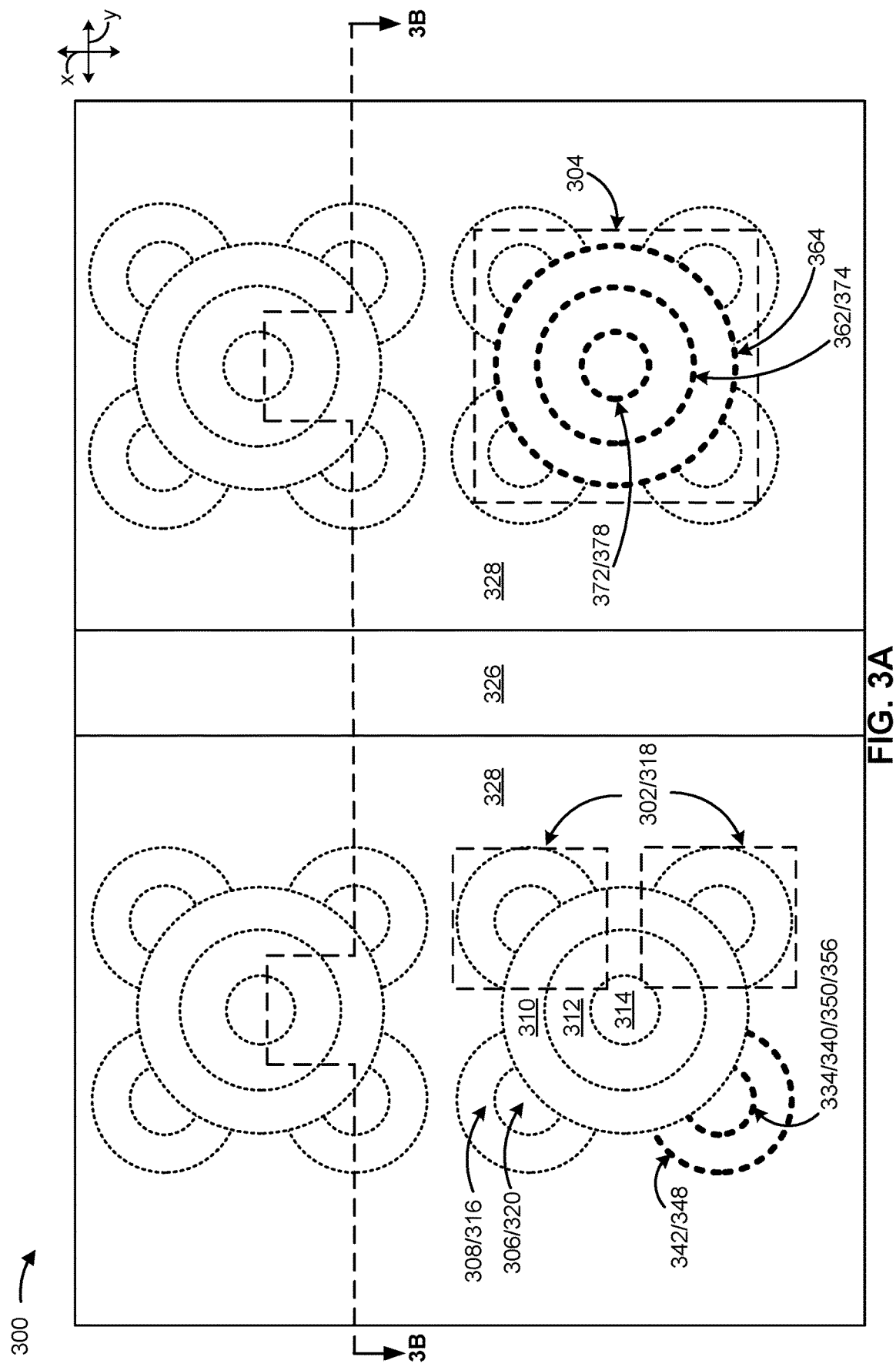
FIGS. 3A-3E are diagrammatic views of an example structure described herein.
Figure 3B:
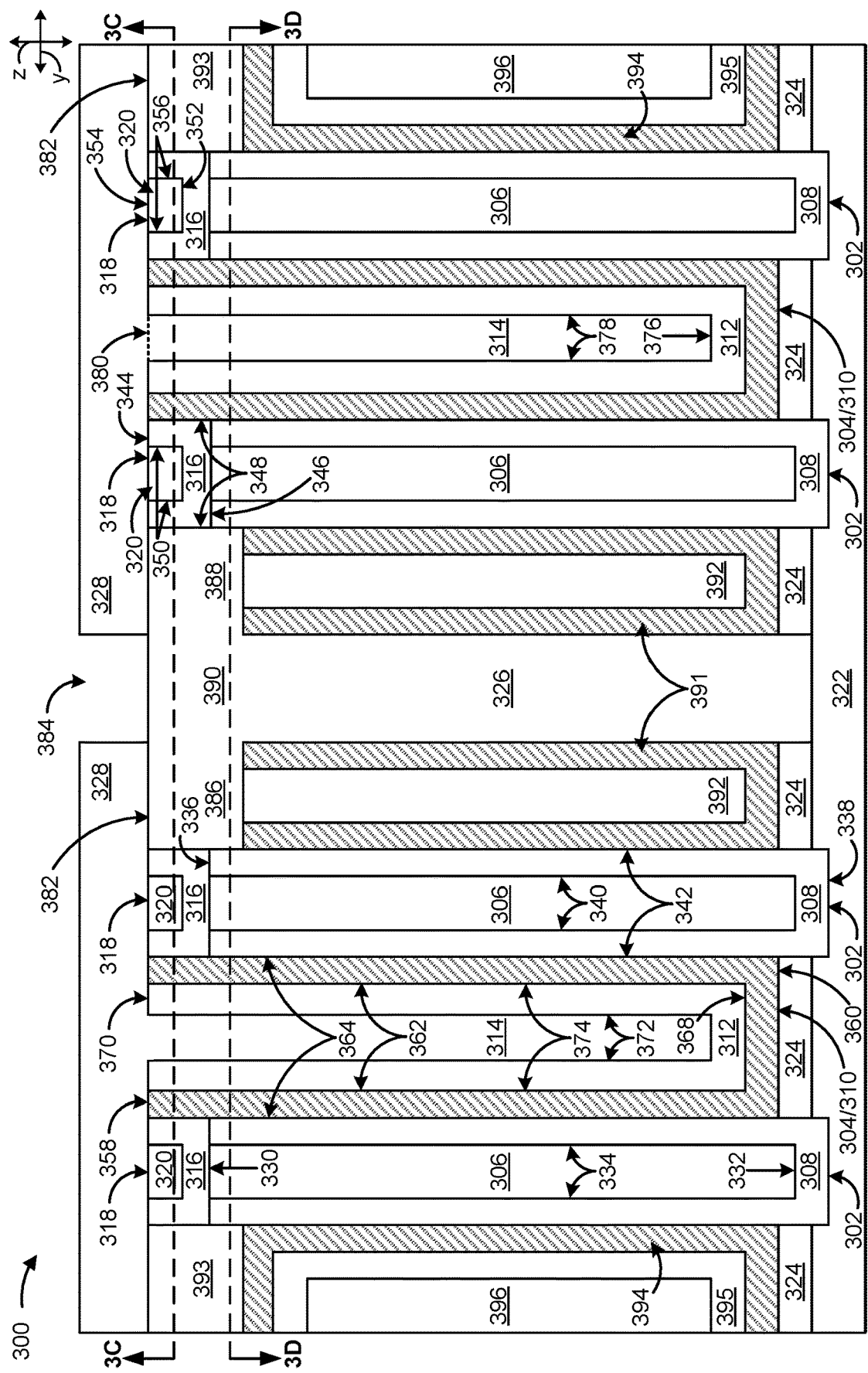

As shown in FIG. 3B, in some implementations, the top surface 336 of the bottom electrode 308 is substantially horizontally aligned with the top surface 330 of the support pillar 306. However, in some implementations, the top surface 336 of the bottom electrode 308 is vertically higher than the top surface 330 of the support pillar 306. In this case, a portion of the leaker device 316 may be contained within the open top cylinder shape of the bottom electrode 308 (e.g., the leaker device 316 may extend vertically below the top surface 336 of the bottom electrode 308). In some implementations, the interior circumferential surface 340 of the bottom electrode 308 interfaces with the circumferential surface 334 of the support pillar 306. For example, the interior circumferential surface 340 of the bottom electrode 308 may be along and abutting the circumferential surface 334 of the support pillar 306. Additionally, or alternatively, the interior circumferential surface 340 of the bottom electrode 308 may be substantially vertically aligned with the circumferential surface 334 of the support pillar 306. As further shown, the bottom surface 338 of the bottom electrode 308 is below the bottom surface 332 of the support pillar 306. In some implementations, the support pillar 306 is contained within the open top cylinder shape of the bottom electrode 308. Although the bottom surface 338 of the bottom electrode 308 is shown below the bottom surface of the insulative material 324, in some implementations, the bottom surface 338 of the bottom electrode 308 is substantially horizontally aligned with the bottom surface of the insulative material 324.

The bottom electrode 308 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride or titanium silicon nitride, and/or a metal carbide), and/or a conductively-doped semiconductor material (e.g., conductively-doped silicon, conductively-doped germanium, and/or conductively-doped gallium arsenide), among other examples. In some implementations, the bottom electrode 308 comprises, consists of, or consists essentially of titanium nitride.

The leaker device 316 has a top surface 344, a bottom surface 346, and an exterior circumferential surface 348. In some implementations, the leaker device 316 has an interior circumferential surface 350. In some implementations, the shape of the leaker device 316 is an open top cylinder (within reasonable tolerances of manufacturing and measurement). In this case, the top surface 344 is a top horizontal surface of the open top cylinder (e.g., having a ring shape or an annular shape), the bottom surface 346 is the bottom horizontal surface of the open top cylinder (e.g., having a circular shape), the interior circumferential surface 350 is the interior vertical surface of the open top cylinder (e.g., having a tube shape that forms an interior wall of the open top cylinder), and the exterior circumferential surface 348 is the exterior vertical surface of the open top cylinder (e.g., having a tube shape that forms an exterior wall of the open top cylinder). The interior circumferential surface 350 extends vertically from a bottom surface 352 of the support material 320 to the top surface 344 of the leaker device 316 along the entire circumference of the smaller concentric circle of the annulus that forms the top surface 344. The exterior circumferential surface 348 extends vertically from the bottom surface 346 of the leaker device 316 to the top surface 344 of the leaker device 316 along the entire circumference of the larger concentric circle of the annulus that forms the top surface 344.

As shown in FIG. 3B, in some implementations, the bottom surface 346 of the leaker device 316 interfaces with the top surface 336 of the bottom electrode 308 and/or the top surface 330 of the support pillar 306. For example, the bottom surface 346 of the leaker device 316 may abut and/or may be substantially horizontally aligned with the top surface 336 of the bottom electrode 308 and/or the top surface 330 of the support pillar 306. In some implementations, the bottom surface 346 of the leaker device 316 does not extend vertically below the top surface 336 of the bottom electrode 308 and/or the top surface 330 of the support pillar 306. For example, in some implementations, the bottom surface 346 of the leaker device 316 does not extend vertically below the top surface 336 of the bottom electrode 308 and does not extend vertically below the top surface 330 of the support pillar 306, as shown in FIG. 3B. In such implementations, the bottom surface 346 of the leaker device 316 does not contact any surface of the bottom electrode 308 other than the top surface 336 of the bottom electrode 308. For example, in some implementations, the bottom surface 346 of the leaker device 316 does not contact the interior circumferential surface 340 of the bottom electrode 308. Similarly, in some implementations, the bottom surface 346 of the leaker device 316 does not contact the exterior circumferential surface 342 of the bottom electrode 308. In this case, the bottom surface 346 of the leaker device 316 may be substantially horizontal.

However, in some implementations, the bottom surface 346 of the leaker device 316 extends vertically below the top surface 336 of the bottom electrode 308, but does not extend vertically below the top surface 330 of the support pillar 306. For example, the leaker device 316 may be partially contained within the open top cylinder shape of the bottom electrode 308 (e.g., and may abut the top surface 330 of the support pillar 306). This may increase a surface area of the leaker device 316 in contact with the bottom electrode 308, which may impact a resistance of the leaker device 316. In such implementations, the top surface 330 of the support pillar 306 is vertically lower than and not substantially horizontally aligned with the top surface 336 of the bottom electrode 308. Furthermore, in such implementations, the leaker device 316 may contact a portion of the interior circumferential surface 340 of the bottom electrode 308. In this case, the bottom surface 346 of the leaker device 316 may not be substantially horizontal. For example, a first portion of the bottom surface 346 of the leaker device 316 may abut the top surface 336 of the bottom electrode, and a second portion of the bottom surface 346 of the leaker device 316 may abut the top surface 330 of the support pillar 336 (e.g., where the second portion is vertically lower than the first portion). In this case, the open top cylinder shape of the leaker device 316 may have a bottom that is not flat (e.g., not substantially horizontal). In some implementations, the bottom surface 346 of the leaker device is less than or equal to approximately 5 nanometers below top surface 336 of the bottom electrode 308. In some implementations, the bottom surface 346 of the leaker device does not extend vertically below a bottom surface of insulative support material 393 (described below) and/or a bottom surface of a first horizontal extension 386 and a second horizontal extension 388 of the separation structure 326 (described below).

As further shown, the exterior circumferential surface 348 of the leaker device 316 may be substantially vertically aligned with the exterior circumferential surface 342 of the bottom electrode 308. For example, the exterior circumferential surface 348 of the leaker device 316 may be substantially vertically aligned with the exterior circumferential surface 342 of the bottom electrode 308 along an entire circumference of the exterior circumferential surface 342 and an entire circumference of the exterior circumferential surface 348.

The leaker device 316 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, and/or a metal carbide), and/or a conductively-doped semiconductor material (e.g., conductively-doped silicon, conductively-doped germanium, and/or conductively-doped gallium arsenide). In some implementations, the leaker device 316 may be a same material as or a different material than the bottom electrode 308.

The support material 320 has a bottom surface 352, a top surface 354, and a circumferential surface 356. In some implementations, the shape of the support material 320 is a cylinder (within reasonable tolerances of manufacturing and measurement). In other words, the support material 320 may be substantially cylindrical in shape. In this case, the top surface 354 is a top horizontal surface of the cylinder (e.g., having a circular shape), the bottom surface 352 is the bottom horizontal surface of the cylinder (e.g., having a circular shape), and the circumferential surface 356 is the vertical surface of the cylinder (e.g., having a tube shape that connects the circular shapes on either end). The circumferential surface 356 extends vertically from the top surface 354 to the bottom surface 352 along the entire circumference of the cylinder.

As shown in FIG. 3B, in some implementations, the top surface 354 of the support material 320 is substantially horizontally aligned with the top surface 344 of the leaker device 316. In some implementations, the interior circumferential surface 350 of the leaker device 316 interfaces with the circumferential surface 356 of the support material 320. For example, the interior circumferential surface 350 of the leaker device 316 may be along and abutting the circumferential surface 356 of the support material 320. Additionally, or alternatively, the interior circumferential surface 350 of the leaker device 316 may be substantially vertically aligned with the circumferential surface 356 of the support material 320. As further shown, the bottom surface 346 of the leaker device 316 is below the bottom surface 352 of the support material 320. In some implementations, the support material 320 is contained within the open top cylinder shape of the leaker device 316.

In some implementations, the support material 320 is not present in the structure 300. For example, the pillar 318 may be constructed or configured to achieve certain electrical properties for the leaker device 316, such as an electrical resistance that enables excess charge to be discharged from the bottom electrode 308 to the conductive plate 328 without draining all or too much charge from the bottom electrode 308 to the conductive plate 328. If the leaker device 316 is to be configured with an electrical resistance that enables less than a threshold amount of current to flow (e.g., less than 20 amps) or with greater than a threshold amount of resistance, then the support material 320 may be used to achieve this objective. The size of the support material 320 (e.g., a diameter or height) may be configured to control the electrical resistance of the leaker device 316. In some implementations, if the leaker device 316 is to be configured with an electrical resistance that enables greater than a threshold amount of current to flow (e.g., more than 20 amps) or with less than a threshold amount of resistance, then the support material 320 may not be formed in the structure 300. In this case, the shape of the leaker device 316 may be a cylinder (within reasonable tolerances of manufacturing and measurement).

The support material 320 may be an electrical insulator, an electrical conductor, or a semiconductor, and may comprise, consist of, or consist essentially of insulative material, conductive material, or semiconductive material. For example, the support material 320 may comprise, consist of, or consist essentially silicon nitride and/or silicon (e.g., polycrystalline silicon). In some implementations, the support material 320 has a higher etch resistivity than an oxide (e.g., is not silicon dioxide).

The insulator 310 has a top surface 358, a bottom surface 360, an interior vertical surface 362, and an exterior vertical surface 364 (e.g., a plurality of exterior vertical surfaces 364). The interior vertical surface 362 extends vertically from a bottom surface 368 of the top electrode 312 to the top surface 358 of the insulator 310. The illustrated exterior vertical surface 364 extends vertically from the bottom surface 360 of the insulator 310 to the top surface 358 of the insulator 310. The insulator 310 may include a plurality of exterior vertical surfaces 364 that each wrap around a bottom electrode 308. In some implementations, the top surface 358 of the insulator 310 is substantially horizontally aligned with the top surface 344 of the leaker device 316 and/or the top surface 354 of the support material 320. Additionally, or alternatively, the top surface 358 of the insulator 310 may be vertically higher than the top surface 330 of the support pillar 306 and/or the top surface 336 of the bottom electrode 308. However, in some implementations, the insulator 310 (e.g., insulative material of the insulator 310) is not above or on top of the support pillar 306 and/or the bottom electrode 308. In other words, in some implementations, the insulator 310 is not present in an area above the bottom electrode 308 bounded by an imaginary upward extension of the exterior circumferential surface 342 of the bottom electrode 308. Similarly, in some implementations, the insulator 310 is not present in an area above the support pillar 306 bounded by an imaginary upward extension of the circumferential surface 334 of the support pillar 306. The terms "interior" vertical surface and "exterior" vertical surface are used for explanatory purposes in connection with the accompanying figures. In some cases, an exterior vertical surface 364 may be called a first vertical surface 364, and an interior vertical surface 362 may be called a second vertical surface 362.

In some implementations, the bottom surface 360 of the insulator 310 is vertically higher than the bottom surface 332 of the support pillar 306 and/or the bottom surface 338 of the bottom electrode 308. As shown in FIG. 3B, the bottom surface 360 of the insulator may interface with the insulative material 324. For example, the bottom surface 360 of the insulator 310 may abut and/or may be substantially horizontally aligned with a top surface of the insulative material 324.

In some implementations, the exterior vertical surface 364 of the insulator 310 interfaces with the exterior circumferential surface 342 of the bottom electrode 308. For example, the exterior vertical surface 364 of the insulator 310 may be along, may abut, and/or may be in contact with the exterior circumferential surface 342 of the bottom electrode 308. In some implementations, the exterior vertical surface 364 of the insulator 310 wraps completely around a circumference of the exterior circumferential surface 342 of the bottom electrode 308 (although not necessarily along an entire height of the exterior circumferential surface 342 of the bottom electrode 308). As further shown, the exterior vertical surface 364 of the insulator 310 may interface with (e.g., may be along, may abut, may be in contact with, and/or may wrap completely around) the exterior circumferential surfaces 342 of multiple bottom electrodes 308 (e.g., all bottom electrodes 308 that are between consecutive separation structures 326, with no intervening separation structures 326).

Additionally, or alternatively, the exterior vertical surface 364 of the insulator 310 may interface with the exterior circumferential surface 348 of the leaker device 316. For example, the exterior vertical surface 364 of the insulator 310 may be along, may abut, and/or may be in contact with the exterior circumferential surface 348 of the leaker device 316. In some implementations, the exterior vertical surface 364 of the insulator 310 wraps partially around a circumference of the exterior circumferential surface 348 of the leaker device 316 (along an entire height of the exterior circumferential surface 348 of the leaker device 316, in some implementations). As further shown, in some implementations, the exterior vertical surface 364 of the insulator 310 may interface with (e.g., may be along, may abut, may be in contact with, and/or may wrap partially around) the exterior circumferential surfaces 348 of multiple leaker devices 316 (e.g., all leaker devices 316 that are between consecutive separation structures 326, with no intervening separation structures 326).

The insulator 310 may be an electrical insulator and may comprise, consist of, or consist essentially of insulative material. The insulative material may comprise, consist of, or consist essentially of silicon dioxide, silicon nitride, aluminum oxide, and/or hafnium oxide, among other examples. In some implementations, the insulator 310 comprises, consists of, or consists essentially of ferroelectric material. The ferroelectric material may comprise, consist of, or consist essentially of hafnium oxide, hafnium zirconium oxide, barium titanate, lead titanate, lead zirconate titanate, and/or strontium bismuth tantalate, among other examples.

The top electrode 312 has a bottom surface 368, a top surface 370, an interior vertical surface 372, and an exterior vertical surface 374. The interior vertical surface 372 extends vertically from a bottom surface 376 of the fill material 314 to the top surface 370 of the top electrode 312. The exterior vertical surface 374 extends vertically from the bottom surface 368 of the top electrode 312 to the top surface 370 of the top electrode 312. In some implementations, the top surface 370 of the top electrode 312 is substantially horizontally aligned with the top surface 358 of the insulator 310. Additionally, or alternatively, the top surface 370 of the top electrode 312 may be substantially horizontally aligned with the top surface 344 of the leaker device 316 and/or the top surface 354 of the support material 320. Additionally, or alternatively, the top surface 370 of the top electrode 312 may be vertically higher than the top surface 330 of the support pillar 306 and/or the top surface 336 of the bottom electrode 308. However, in some implementations, the top electrode 312 (e.g., conductive material of the top electrode 312) is not above or on top of the support pillar 306 and/or the bottom electrode 308. In other words, in some implementations, the top electrode 312 is not present in an area above the bottom electrode 308 bounded by an imaginary upward extension of the exterior circumferential surface 342 of the bottom electrode 308. Similarly, in some implementations, the top electrode 312 is not present in an area above the support pillar 306 bounded by an imaginary upward extension of the circumferential surface 334 of the support pillar 306. The terms "interior" vertical surface and "exterior" vertical surface are used for explanatory purposes in connection with the accompanying figures. In some cases, the exterior vertical surface 374 may be called a first vertical surface 374, and the interior vertical surface 372 may be called a second vertical surface 372.

In some implementations, the exterior vertical surface 374 of the top electrode 312 interfaces with (e.g., is along, abutting, and/or in contact with) the interior vertical surface 362 of the insulator 310 (e.g., along an entire height of the exterior vertical surface 374 of the top electrode 312). Additionally, or alternatively, the exterior vertical surface 374 of the top electrode 312 may be substantially vertically aligned with the interior vertical surface 362 of the insulator 310. As further shown, the bottom surface 360 of the insulator 310 is below the bottom surface 368 of the top electrode 312.

The insulator 310 may separate (e.g., physically separate and/or be a barrier between) a top electrode 312 and one or more bottom electrodes 308. In some implementations, the top electrode 312 is shared among multiple bottom electrodes 308 (e.g., all bottom electrodes 308 that are between consecutive separation structures 326, with no intervening separation structures 326). Thus, the insulator 310 may separate the top electrode 312 from multiple bottom electrodes 308 (e.g., all bottom electrodes 308 that are between consecutive separation structures 326, with no intervening separation structures 326). In some implementations, the structure 300 includes a single top electrode 312 between consecutive separation structures 326. The top electrode 312 is also shown by reference numbers 392 and 395, as a continuation of the top electrode 312 that wraps around the bottom electrodes 308, although separated by the insulator 310/391/394. Each bounded region of the structure 300 that is bounded by separation structures 326 and/or array edges may include a corresponding top electrode 312 that is shared among all bottom electrodes and/or memory cells within that bounded region. The voltage of a conductive plate 328 may be controlled to control a voltage of a top electrode 312 coupled to the conductive plate 328. The bottom electrodes 308 may be separately controlled from one another (e.g., via respective digit lines 120) so that a voltage difference between top and bottom electrodes can be controlled by manipulating the voltage of the conductive plate 328 and the voltage of digit lines 120.

The top electrode 312 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, titanium silicon nitride, and/or a metal carbide), and/or a conductively-doped semiconductor material (e.g., conductively-doped silicon, conductively-doped germanium, and/or conductively-doped gallium arsenide), among other examples. In some implementations, the top electrode 312 comprises, consists of, or consists essentially of titanium nitride and/or titanium silicon nitride.

The fill material 314 has a bottom surface 376 and a vertical surface 378. In some implementations, the interior vertical surface 372 of the top electrode 312 interfaces with (e.g., is along, abutting, and/or in contact with) the vertical surface 378 of the fill material 314. Additionally, or alternatively, the interior vertical surface 372 of the top electrode 312 may be substantially vertically aligned with the vertical surface 378 of the fill material 314. As further shown, the bottom surface 360 of the top electrode 312 is below the bottom surface 376 of the fill material 314.

In some implementations, the fill material 314 is a different material than the conductive plate 328. For example, the fill material 314 may comprise, consist of, or consist essentially of an insulative material, a semiconductive material, or a conductive material different from the conductive material of the conductive plate 328. In this case, the fill material 314 has a top surface 380 (shown in broken lines in FIG. 3B), which may be substantially horizontally aligned with the top surface 370 of the top electrode 312, the top surface 358 of the insulator 310, the top surface 344 of the leaker device 316, and/or the top surface 354 of the support material 320. Alternatively, the fill material 314 may be the same material as the conductive plate 328, in which case the conductive material of the conductive plate 328 may extend downward into and abut the interior vertical surface 372 the top electrode 312 (e.g., along an entire height of the interior vertical surface 372 of the top electrode 312). The fill material 314 is also shown by reference number 396, as a continuation of the fill material 314 that interfaces with the insulator 310/391/394.

The conductive plate 328 may interface with (e.g., may be along, abutting, and/or in contact with) a horizontal surface 382. The horizontal surface 382 may span across multiple memory cells (e.g., a large number of memory cells), such as an entire memory array. As shown in FIG. 3B, the horizontal surface 382 may be substantially horizontally aligned with the top surface 370 of the top electrode 312, the top surface 358 of the insulator 310, the top surface 344 of the leaker device 316, and/or the top surface 354 of the support material 320.

In some implementations, a gap 384 may be formed between conductive plates 328. The gap 384 may extend along the illustrated x-direction. In some implementations, a width of the gap (in the illustrated y-direction) may be less than or equal to approximately 50 nanometers, or may be between approximately 10 nanometers and approximately 50 nanometers, inclusive. As a result of forming the gap 384, multiple conductive plates 328 may be present in the structure 300. Each conductive plate 328 may span and/or cover a portion of the memory array. Each conductive plate 328 may be electrically isolated from one another. Thus, each conductive plate 328 may be configured to independently interact with a portion of memory cells in the memory array (e.g., may interact with top electrode(s) 312 associated with those memory cells). A conductive plate 328 may be coupled with a top electrode 312 that is associated with all memory cells in a bounded region of the memory array, where the bounded region is bounded by consecutive separation structures 326 (and/or one or more edges of the memory array). Different conductive plates 328 may be coupled with different top electrodes 312 (e.g., a first conductive plate 328 may be coupled with a first top electrode 312, a second conductive plate 328 may be coupled with a second top electrode 312, and so on). Additionally, or alternatively, the conductive plate 328 may extend horizontally along a top surface 370 of a top electrode 312 and/or along top surfaces 344 of multiple leaker devices 316. Having different conductive plates 328 in the memory device allows different voltages to be applied to different groups of memory cells (e.g., that share a top electrode 312).

A leaker device 316 may couple a bottom electrode 308 to the conductive plate 328. The leaker device 316 may be configured to discharge excess charge (or at least a portion of excess charge) from the bottom electrode 308 to the conductive plate 328. The leaker device 316 may be configured with an electrical resistance to enable removal of excess charge from the bottom electrode 308 without removing too much charge from the bottom electrode 308 (e.g., without electrically shorting the bottom electrode 308 to the conductive plate 328). In some implementations, a resistance of the leaker device 316 may be configured by forming the leaker device 316 with a particular interior circumference (e.g., of the smaller concentric circle that forms the annulus of the top surface 344 of the leaker device), with a particular exterior circumference (e.g., of the larger concentric circle that forms the annulus of the top surface 344 of the leaker device), with a particular height of the support material 320 contained within the leaker device 316 (or without any support material 320 contained within the leaker device 316), with a particular height of the leaker device 316 (e.g., from the top surface 344 to the bottom surface 346), with a particular alignment with the bottom electrode 308 (e.g., vertically aligned or not vertically aligned), and/or with a particular material, among other examples.

The conductive plate 328 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, the conductive plate 328 may be a same material as or a different material than the fill material 314. In some implementations, the conductive plate 328 is a different material than the bottom electrode 308, the top electrode 312, and/or the leaker device 316. In some implementations, the conductive material of the conductive plate 328 may be along, abutting, and/or in contact with the interior vertical surface 372 of a top electrode 312.

The separation structure 326 may extend vertically from the substrate 322 to a top surface of the separation structure 326, which may be substantially horizontally aligned with the horizontal surface 382 and/or any other surfaces described herein as being substantially horizontally aligned with the horizontal surface 382. Thus, a bottom surface of the separation structure 326 may interface with (e.g., may be along, abutting, and/or in contact with) a top surface of the substrate 322. A top surface of the separation structure 326 may interface with (e.g., may be along, abutting, and/or in contact with) respective bottom surfaces of multiple (e.g., two) conductive plates 328. For example, the top surface of the separation structure 326 may be substantially horizontally aligned with a bottom surface of a first conductive plate 328 and a bottom surface of a second conductive plate 328.

As shown, the separation structure 326 may include a first horizontal extension 386 and a second horizontal extension 388 that extend horizontally in opposite directions at a top portion 390 of the separation structure 326. The top portion 390 of the separation structure 326 may abut the conductive plate(s) 328. The first horizontal extension 386 and the second horizontal extension 388 may extend horizontally from a vertical center line of the separation structure 326. Thus, the separation structure 326 may be wider at the top portion 390 than at a vertical middle portion of the separation structure 326 or at a bottom portion of the separation structure 326. In some implementations, a width of the vertical middle portion of the separation structure 326 (in the illustrated y-direction) may be less than or equal to approximately 50 nanometers, or may be between approximately 10 nanometers and approximately 50 nanometers, inclusive.

As shown, a first conductive plate 328 (shown on the left of FIG. 3B) may abut the first horizontal extension 386 of the separation structure 326, and a second conductive plate 328 (shown on the right of FIG. 3B) may abut the second horizontal extension 388 of the separation structure 326. The gap 384 between the first conductive plate 328 and the second conductive plate 328 may be above the top portion 390 of the separation structure 326 that is located between the first horizontal extension 386 and the second horizontal extension 388.

The separation structure 326 may be an electrical insulator and may comprise, consist of, or consist essentially of insulative material. The insulative material may comprise, consist of, or consist essentially of silicon dioxide, silicon nitride, aluminum oxide, and/or hafnium oxide, among other examples. In some implementations, the separation structure 326 may be a different material than the insulator 310.

In some implementations, insulative material 391 (e.g., of the insulator 310) and/or conductive material 392 (of the top electrode 312) are below the first horizontal extension 386 and the second horizontal extension 388. The insulative material 391 may be part of the insulator 310 (e.g., the insulative material 391 and the insulator 310 may be the same material). The illustrated insulative material 391 and the illustrated insulator 310, which are not shown as being in contact with one another along the cross section of FIG. 3B, are in contact with one another along another cross-section of the structure 300. Thus, although given different reference numbers for purposes of illustration, the insulator 310 and the insulative material 391 are part of the same component (e.g., the insulator 310). For example, the insulator 310 may wrap around the exterior circumferential surfaces 342 of each bottom electrode 308. In other words, the insulator 310 may be in contact with an exterior circumferential surface 342 of a bottom electrode 308 along an entire circumference of the exterior circumferential surface 342 (but not along an entire height of the exterior circumferential surface 342). This increases a surface area contact between the insulator 310 and the bottom electrode 308, thereby increasing storage capacity.

Similarly, the conductive material 392 may be part of the top electrode 312. (e.g., the conductive material 392 and the top electrode 312 may be the same material). The illustrated conductive material 392 and the illustrated top electrode 312, which are not shown as being in contact with one another along the cross section of FIG. 3B, are in contact with one another along another cross-section of the structure 300. Thus, although given different reference numbers for purposes of illustration, the top electrode 312 and the conductive material 392 are part of the same component (e.g., the top electrode 312). For example, the top electrode 312 may wrap around a region of the insulator 310 that wraps around the exterior circumferential surfaces 342 of each bottom electrode 308. This increases a surface area contact between the insulator 310 and the top electrode 312, thereby increasing storage capacity.

As shown, the insulative material 391 may abut the separation structure 326, insulative material 324, and/or a bottom electrode 308. The conductive material 392 may abut the separation structure 326 and/or the insulative material 391. In some implementations, the insulative material 391 is the same as the insulative material of the insulator 310. In some implementations, the conductive material 392 is the same as the conductive material of the top electrode 312. In some implementations, fill material 314 (e.g., of the conductive plate 328) is not below the first horizontal extension 386 and/or is not below the second horizontal extension 388 (e.g., to prevent shorting of conductive plates 328 across bounded regions).

As further shown in FIG. 3B, insulative support material 393 may abut a conductive plate 328. For example, a top surface of the insulative support material 393 may interface with (e.g., may be along, abutting, and/or in contact with) a bottom surface of a conductive plate 328. For example, the top surface of the insulative support material 393 may be substantially horizontally aligned with a bottom surface of a conductive plate 328 (and/or the horizontal surface 382 and/or any other surfaces described herein as being substantially horizontally aligned with the horizontal surface 382). In some implementations, the insulative support material 393 may abut one or more bottom electrodes 308. For example, the insulative support material 393 may be between and/or abutting multiple bottom electrodes 308.

Figure 3C:
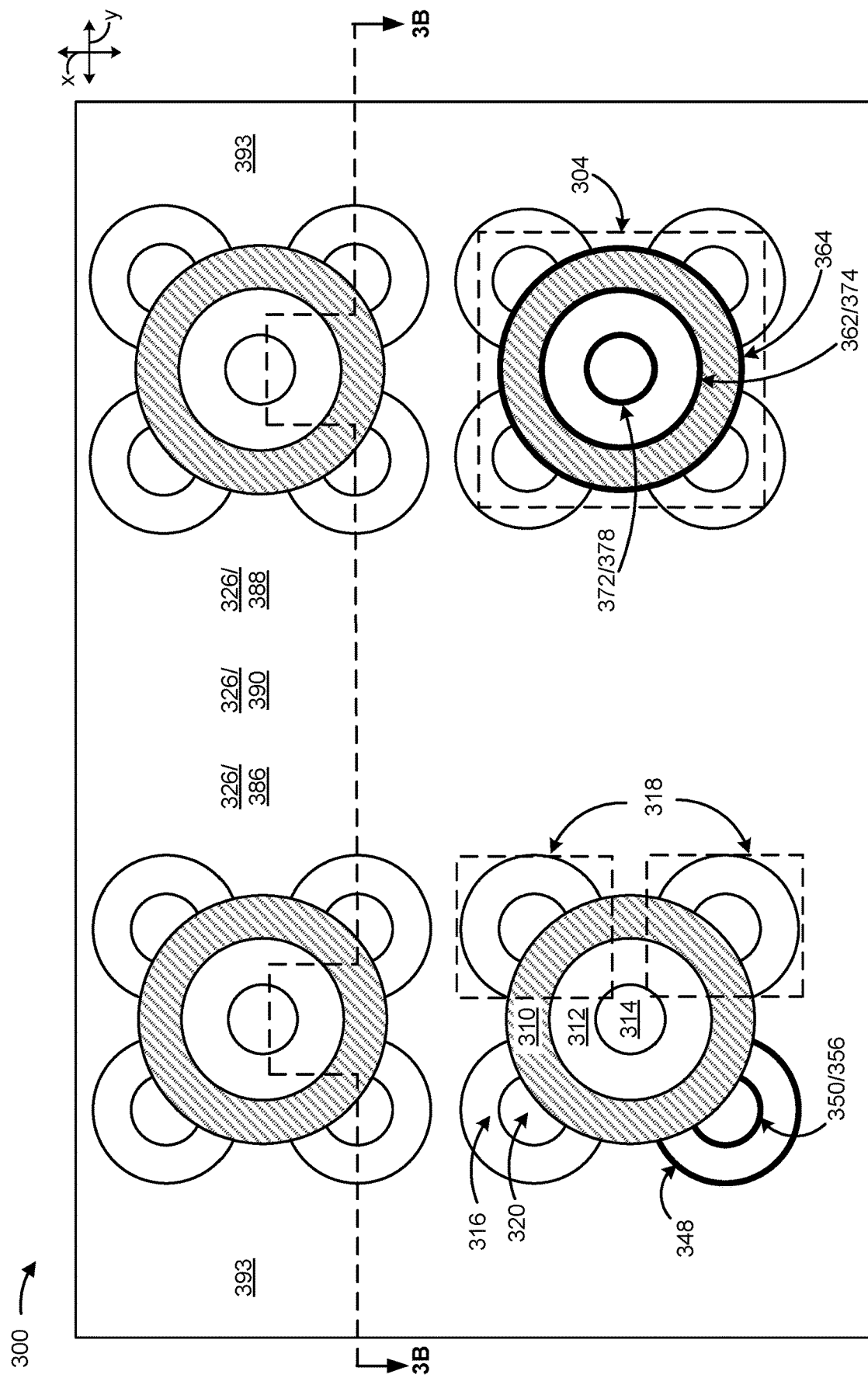
Figure 3D:
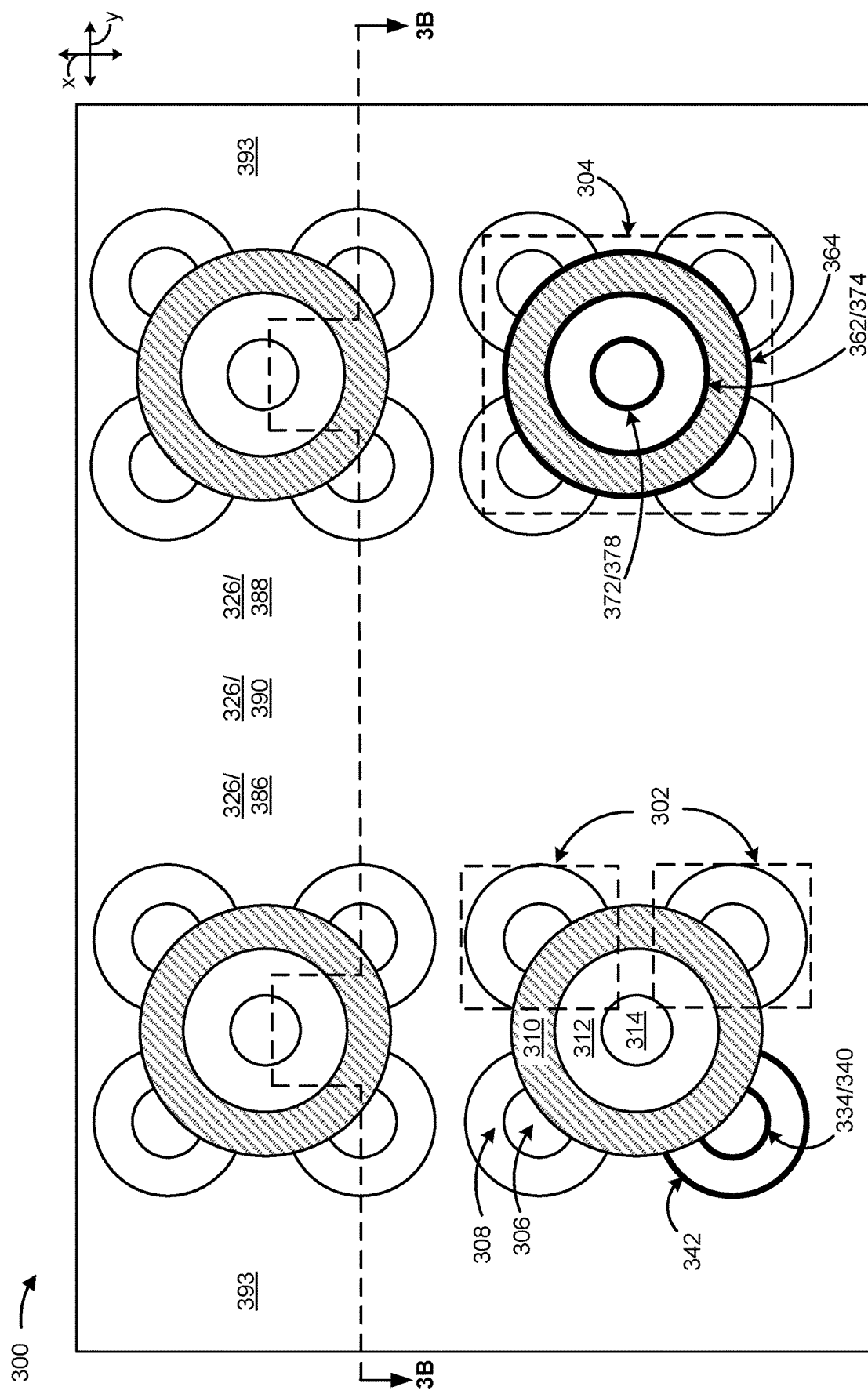

The insulative support material 393 may be an electrical insulator and may comprise, consist of, or consist essentially of insulative material. The insulative material may comprise, consist of, or consist essentially of silicon dioxide, silicon nitride, aluminum oxide, and/or hafnium oxide, among other examples. In some implementations, the insulative support material 393 may be a same material as the separation structure 326. For example, as shown in FIGS. 3C and 3D, the insulative support material 393 and the separation structure 326 may be part of the same support structure and may be formed from the same material. In some implementations, the insulative support material 393 may be a different material than the insulator 310.

In some implementations, insulative material 394 (e.g., of the insulator 310), conductive material 395 (e.g., of the top electrode 312), and/or conductive material 396 (e.g., of the fill material 314 and/or the conductive plate 328) are below the insulative support material 393. The insulative material 394 may be part of the insulator 310 (e.g., the insulative material 394 and the insulator 310 may be the same material). The illustrated insulative material 394 and the illustrated insulator 310, which are not shown as being in contact with one another along the cross section of FIG. 3B, are in contact with one another along another cross-section of the structure 300. Thus, although given different reference numbers for purposes of illustration, the insulator 310 and the insulative material 394 are part of the same component (e.g., the insulator 310). For example, the insulator 310 may wrap around the exterior circumferential surfaces 342 of each bottom electrode 308. In other words, the insulator 310 may be in contact with an exterior circumferential surface 342 of a bottom electrode 308 along an entire circumference of the exterior circumferential surface 342 (but not along an entire height of the exterior circumferential surface 342). This increases a surface area contact between the insulator 310 and the bottom electrode 308, thereby increasing storage capacity.

Similarly, the conductive material 395 may be part of the top electrode 312. (e.g., the conductive material 395 and the top electrode 312 may be the same material). The illustrated conductive material 395 and the illustrated top electrode 312, which are not shown as being in contact with one another along the cross section of FIG. 3B, are in contact with one another along another cross-section of the structure 300. Thus, although given different reference numbers for purposes of illustration, the top electrode 312 and the conductive material 395 are part of the same component (e.g., the top electrode 312). For example, the top electrode 312 may wrap around a region of the insulator 310 that wraps around the exterior circumferential surfaces 342 of each bottom electrode 308. This increases a surface area contact between the insulator 310 and the top electrode 312, thereby increasing storage capacity.

Similarly, the conductive material 396 may be part of the fill material 314. (e.g., the conductive material 396 and the top electrode 312 may be the same material). The illustrated conductive material 396 and the illustrated fill material 314, which are not shown as being in contact with one another along the cross section of FIG. 3B, are in contact with one another along another cross-section of the structure 300. Thus, although given different reference numbers for purposes of illustration, the fill material 314 and the conductive material 396 are part of the same component (e.g., the fill material 314, which may also be part of the conductive plate 328). For example, the fill material 314 may wrap around a region of the top electrode 312 that wraps around a region of the insulator 310 that wraps around the exterior circumferential surfaces 342 of each bottom electrode 308. This increases a surface area contact between the conductive plate 328 and the top electrode 312.

As shown, the insulative material 394 may abut insulative support material 393, insulative material 324, and/or a bottom electrode 308. The conductive material 395 may abut the insulative material 394 and/or the conductive material 396. The conductive material 396 may abut the conductive material 395. In some implementations, the insulative material 394 is the same as the insulative material of the insulator 310 and/or the insulative material 391. In some implementations, the conductive material 395 is the same as the conductive material of the top electrode 312. In some implementations, the conductive material 396 is the same as the conductive material of the conductive plate 328.

As shown, the structure 300 may be supported by the substrate 322. The substrate 322 may couple a bottom electrode 308 to a corresponding transistor. In some implementations, the substrate 322 may couple multiple bottom electrodes 308 to multiple corresponding transistors. The substrate 322 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, the substrate 322 may be a same material as the conductive plate 328.

The insulative material 324 may separate the insulator 310 from the substrate 322. Additionally, or alternatively, the insulative material 324 may separate the insulative material 391 and/or the insulative material 394 from the substrate 322. The insulative material 324 may be an electrical insulator and may comprise, consist of, or consist essentially of silicon dioxide, silicon nitride, aluminum oxide, and/or hafnium oxide, among other examples. In some implementations, the insulative material 324 may be a different material than the insulator 310.

In some implementations, the width of the pillar 302 (e.g., a combined width of the support pillar 306 and the bottom electrode 308) along the y-axis and the illustrated cross-section of FIG. 3B may be less than or equal to approximately 14 nanometers, or may be between approximately 14 nanometers and approximately 20 nanometers, inclusive. Additionally, or alternatively, a diameter of the pillar 302 (e.g., a combined diameter of the support pillar 306 and the bottom electrode 308) may be less than or equal to approximately 14 nanometers, or may be between approximately 14 nanometers and approximately 20 nanometers, inclusive. In some implementations, the width of the structure 304 (e.g., a combined width of the insulator 310, the top electrode 312, and the fill material 314) along the y-axis and the illustrated cross-section of FIG. 3B may be less than or equal to approximately 24 nanometers. Additionally, or alternatively, a diameter of the structure 304 (e.g., a combined diameter of the insulator 310, the top electrode 312, and the fill material 314 at the horizontal surface 382) and/or the insulator 310 (e.g., at the horizontal surface 382) may be less than or equal to approximately 30 nanometers, or may be between approximately 30 nanometers and approximately 44 nanometers, inclusive. In some implementations, a diameter of the top electrode 312 (e.g., at the horizontal surface 382) may be less than or equal to approximately 15 nanometers, or may be between approximately 15 nanometers and approximately 29 nanometers, inclusive. In some implementations, a diameter of the fill material 314 (e.g., at the horizontal surface 382) may be less than or equal to approximately 1 nanometer, or may be between approximately 1 nanometer and approximately 10 nanometers, inclusive. The above diameters are examples when the structure 300 is viewed from the cross-sectional view shown in FIG. 3A.

Thus, in some implementations, a pitch of the structure 300 along the y-axis may be less than or equal to approximately 38 nanometers. For example, a distance from a left edge of a pillar 302 or a bottom electrode 308 to a left edge of a neighboring pillar 302 or a neighboring bottom electrode 308 (e.g., that shares a top electrode 312 with the pillar 302 or the bottom electrode 308) may be approximately 26 nanometers (or less than 26 nanometers).

In some implementations, the width of the separation structure 326 at a middle vertical portion of the separation structure 326 (e.g., between the insulative material 391 that abuts either side of the separation structure 326) along the y-axis and the illustrated cross-section of FIG. 3B may be less than or equal to 14 nanometers. In some implementations, the width and/or diameter of the separation structure 326 at a middle vertical portion of the separation structure 326 is the same as the width and/or diameter of the pillar 302. In some implementations, a height of the insulative support material 393 and/or a height of the top portion 390 of the separation structure 326 may be greater than 100 nanometers, less than 300 nanometers, and/or approximately equal to 200 nanometers. In some implementations, a width of the top portion 390 of the separation structure 326 along the y-axis and the illustrated cross-section of FIG. 3B may be less than or equal to 62 nanometers. In some implementations, a height of the structure 304 may be greater than 500 nanometers, less than 800 nanometers, and/or approximately equal to 700 nanometers.

In some implementations, a height of the insulative material 391 (and/or a height of an area below the top portion 390 and above the insulative material 324) may be greater than 400 nanometers, less than 600 nanometers, and/or approximately equal to 500 nanometers. In some implementations, a combined width of the insulative material 391 and the conductive material 392 (e.g., between the separation structure 326 and a bottom electrode 308) along the y-axis and the illustrated cross-section of FIG. 3B may be less than or equal to approximately 24 nanometers.

In some implementations, a height of the insulative material 394 (and/or a height of an area below the insulative support material 393 and above the insulative material 324) may be greater than 400 nanometers, less than 600 nanometers, and/or approximately equal to 500 nanometers. In some implementations, a combined width of the insulative material 394, the conductive material 395, and the conductive material 396 along the y-axis and the illustrated cross-section of FIG. 3B may be less than or equal to approximately 24 nanometers.

The above dimensions are provided as examples, and the described parts of the structure 300 may have different dimensions in some implementations. For example, some widths and diameters are described above in connection with a pitch of 38 nanometers. Respective widths and diameters may be scaled up or scaled down for different sized pitches, such as 48 nanometers, 43 nanometers, 41 nanometers, or 32 nanometers, among other examples.

Figure 3E:
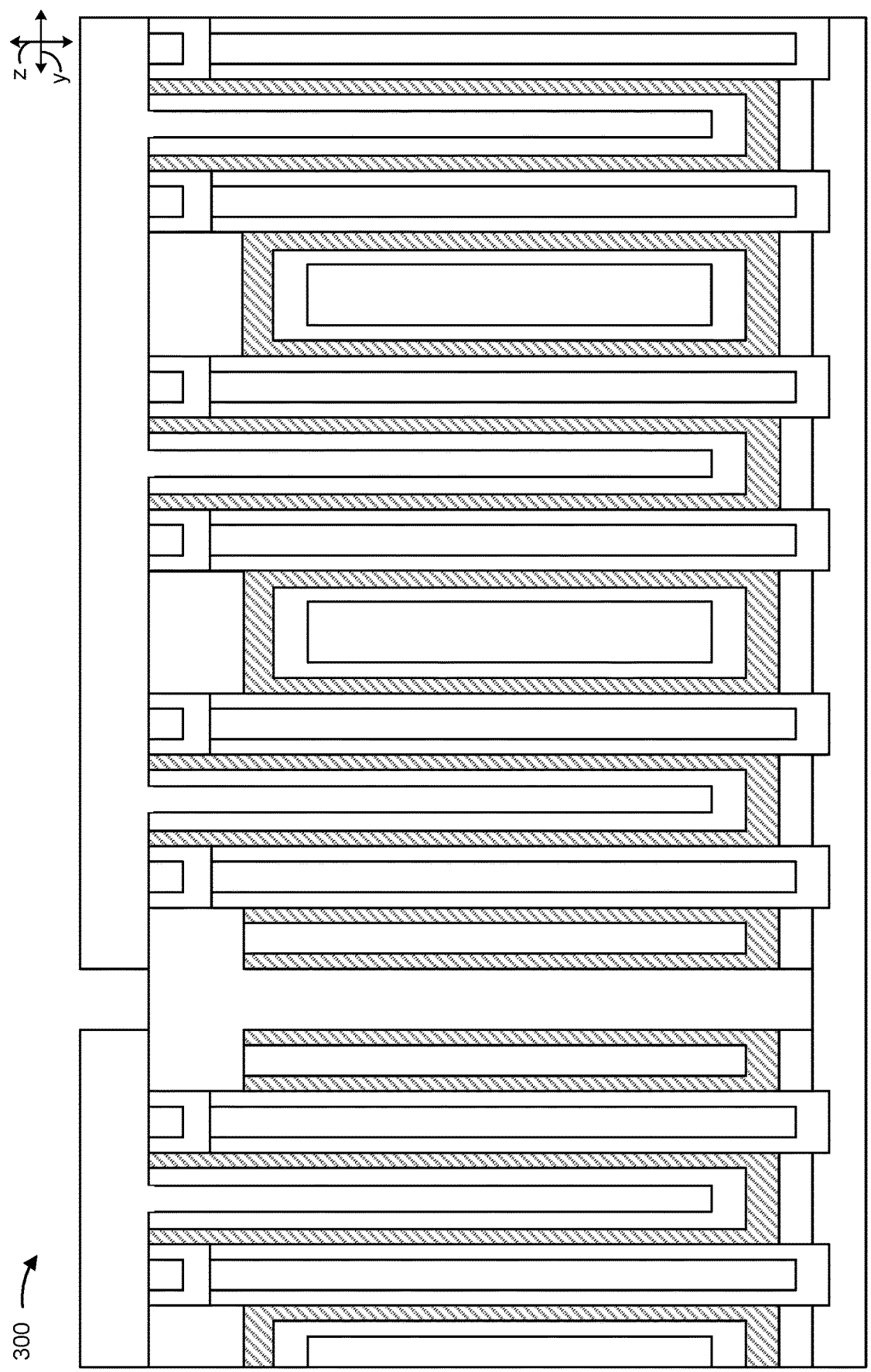

As shown in FIG. 3E, the structure 300 may extend along the y-direction, and there may be multiple instances of portions of the structure 300 (e.g., the pillars 302 and structures 304). For example, the illustrated cross-section may include multiple pillars 302 and multiple structures 304 (e.g., tens, dozens, or the like) before another separation structure 326 is present. A pair of consecutive separation structures 326 may contain (between them) tens, dozens, or more of pillars 302 and structures 304 (e.g., memory cells) along the illustrated cross-section.

The structure 300 may be part of an integrated assembly, such as a memory array, a portion of a memory array, or a memory device that includes the memory array. For example, a memory device may include multiple memory cells (e.g., an array of memory cells). A memory cell may include a capacitor and a transistor. The capacitor may include a bottom electrode 308, a top electrode 312, and an insulator 310 that separates the bottom electrode 308 and the top electrode 312. In some implementations, the top electrode 312 is shared among multiple capacitors corresponding to multiple memory cells (e.g., in a bounded region, described elsewhere herein). The transistor (not shown in FIGS. 3A-3E) may enable access to the capacitor (e.g., a bottom electrode 308 of the capacitor) via a digit line, as described above in connection with FIG. 1. The memory cell may also include a leaker device 316. The leaker device 316 may couple the bottom electrode 308 and a conductive plate 328 that is included in the memory device. The memory device may include an array with a large quantity of structures 300 and/or memory cells (e.g., hundreds, thousands, millions, or more) that are substantially identical to one another. The structures 300 and/or memory cells may extend across the memory array along the illustrated x-axis and the illustrated y-axis to form a grid pattern or an array pattern. The memory device may include multiple conductive plates 328. Each conductive plate 328 may contact a different plurality of leaker devices 316, corresponding to a plurality of memory cells, and may contact a different top electrode 312 shared by those memory cells.

For example, the bottom electrode 308 may be the bottom electrode 135 of FIG. 1, the top electrode 312 may be the top electrode 140 of FIG. 1, and the insulator 310 may be the insulator 145 of FIG. 1. The conductive plate 328 may be the cell plate 155 and/or may include the plate line 125 (e.g., the fill material 314 may be the plate line 125). The leaker device 316 may be the leaker device 150. The structure 300 may further include the selection circuit 105 of FIG. 1 (such as a transistor with the gate 130 of FIG. 1), the access line 115 of FIG. 1, and the digit line 120 of FIG. 1. Thus, the structure 300 may operate as described above in connection with FIG. 1 and/or FIG. 2 to discharge excess charge from bottom electrodes 308.

Each of the illustrated x-axis, y-axis, and z-axis is substantially perpendicular to the other two axes. For example, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

As indicated above, FIGS. 3A-3E are provided as examples. Other examples may differ from what is described with respect to FIGS. 3A-3E.

Figure 4:
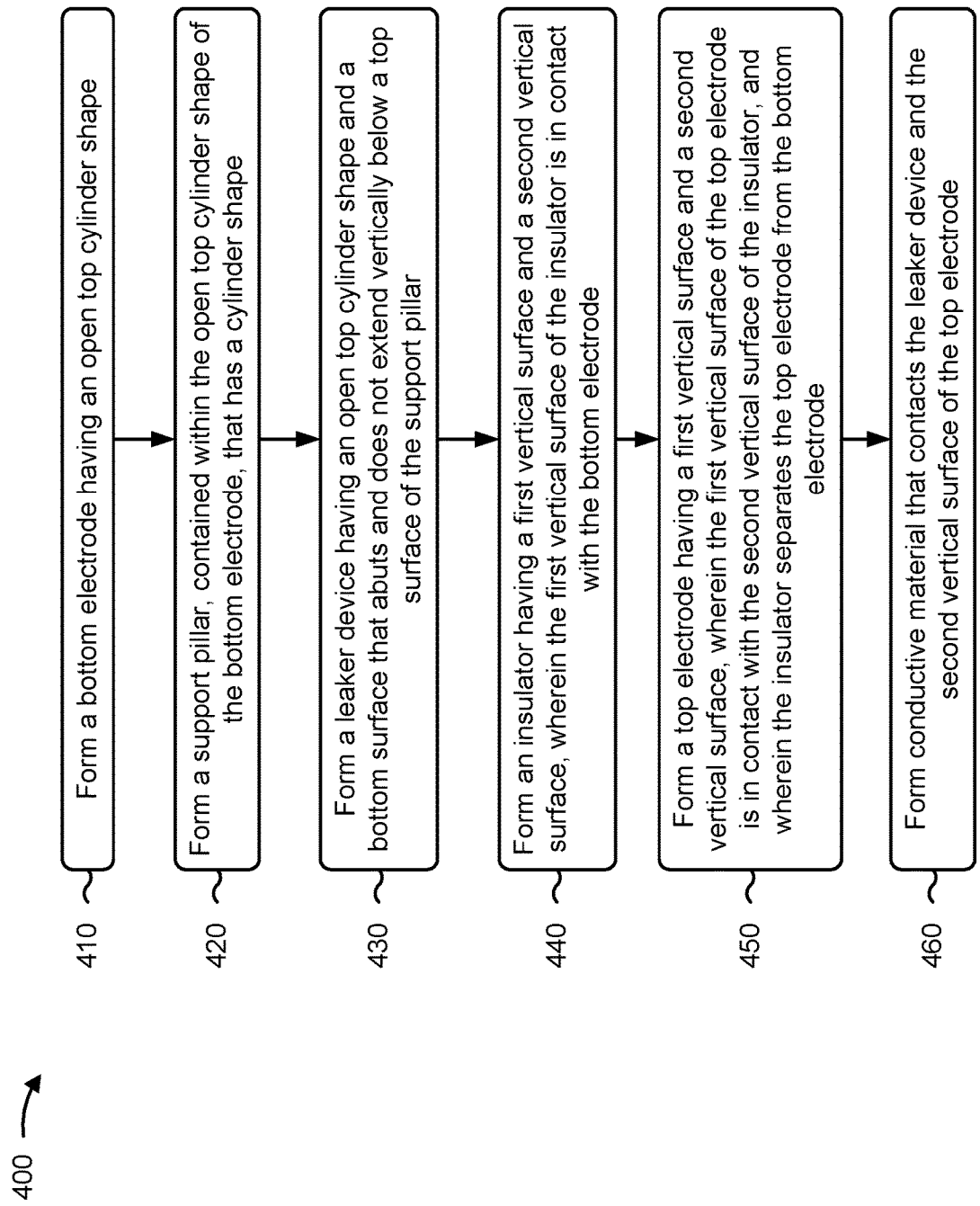
FIG. 4 is a flowchart of an example method 400 of forming an integrated assembly or memory device having a leaker device.

FIG. 4 is a flowchart of an example method 400 of forming an integrated assembly or memory device having a leaker device. In some implementations, one or more process blocks of FIG. 4 may be performed by various semiconductor manufacturing equipment.

As shown in FIG. 4, the method 400 may include forming a bottom electrode having an open top cylinder shape (block 410). As further shown in FIG. 4, the method 400 may include forming a support pillar, contained within the open top cylinder shape of the bottom electrode, that has a cylinder shape (block 420). As further shown in FIG. 4, the method 400 may include forming a leaker device having an open top cylinder shape and a bottom surface that abuts and does not extend vertically below a top surface of the support pillar (block 430). As further shown in FIG. 4, the method 400 may include forming an insulator having a first vertical surface and a second vertical surface, wherein the first vertical surface of the insulator is in contact with the bottom electrode (block 440). As further shown in FIG. 4, the method 400 may include forming a top electrode having a first vertical surface and a second vertical surface, wherein the first vertical surface of the top electrode is in contact with the second vertical surface of the insulator, and wherein the insulator separates the top electrode from the bottom electrode (block 450). As further shown in FIG. 4, the method 400 may include forming conductive material that contacts the leaker device and the second vertical surface of the top electrode (block 460).

Although FIG. 4 shows example blocks of the method 400, in some implementations, the method 400 may include additional blocks, fewer blocks, different blocks, or differently arranged blocks than those depicted in FIG. 4. In some implementations, the method 400 may include forming the structure 300, an integrated assembly that includes the structure 300, any part described herein of the structure 300, and/or any part described herein of an integrated assembly that includes the structure 300. For example, the method 400 may include forming one or more of the parts 302-396.

FIGS. 5A-5B through FIGS. 17A-17B are diagrammatic views showing formation of the structure 300 at example process stages of an example process of forming the structure 300. In some implementations, the example process described below in connection with FIGS. 5A-5B through FIGS. 17A-17B may correspond to the method 400 and/or one or more blocks of the method 400. However, the process described below is an example, and other example processes may be used to form the structure 300, an integrated assembly that includes the structure 300, and/or one or more parts of the structure 300 and/or the integrated assembly.

Figure 5B:
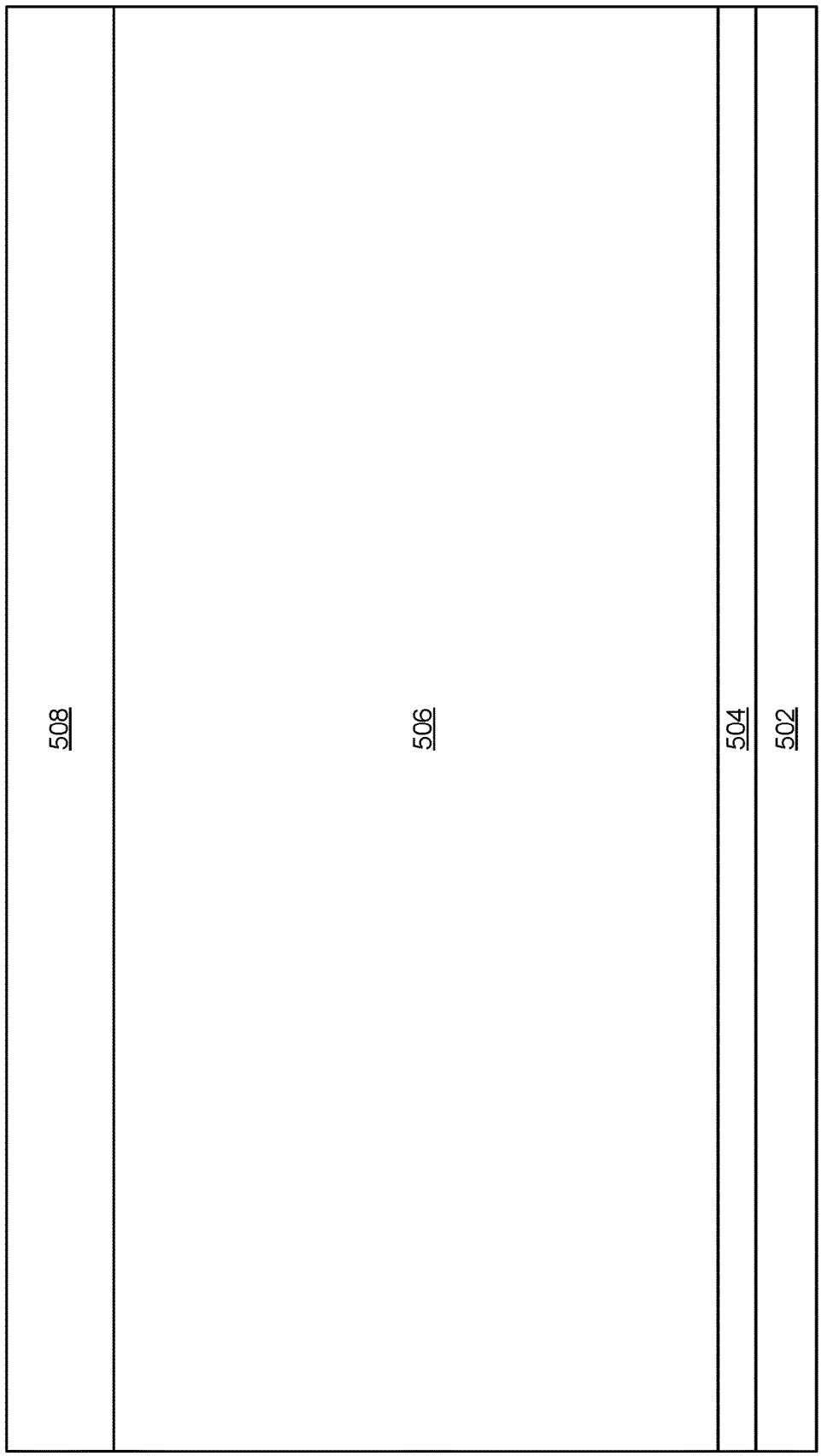

As shown in FIGS. 5A-5B, the process may include forming (e.g., depositing or growing) electrically conductive material 502 on a base (not shown, but which may be beneath the electrically conductive material 502). The electrically conductive material 502 may form the substrate 322 and may comprise, consist of, or consist essentially of one or more of the materials described above in connection with the substrate 322.

As shown in FIGS. 5A-5B, the process may include forming (e.g., depositing or growing) insulative material 504 on the electrically conductive material 502. The insulative material 504 may form the insulative material 324 and may comprise, consist of, or consist essentially of one or more of the materials described above in connection with the insulative material 324.

As shown in FIGS. 5A-5B, the process may include forming (e.g., depositing or growing) insulative material 506 on the insulative material 504. The insulative material 506 may comprise, consist of, or consist essentially of an oxide (e.g., silicon dioxide), among other examples.

As shown in FIGS. 5A-5B, the process may include forming (e.g., depositing or growing) insulative material 508 on the insulative material 506. The insulative material 508 may form the insulative support material 393 and/or the separation structure 326 (or a portion of the separation structure 326, such as the horizontal extensions 386 and/or 388), and may comprise, consist of, or consist essentially of one or more of the materials described above in connection with the insulative support material 393 and/or the separation structure 326.

Figure 6A:
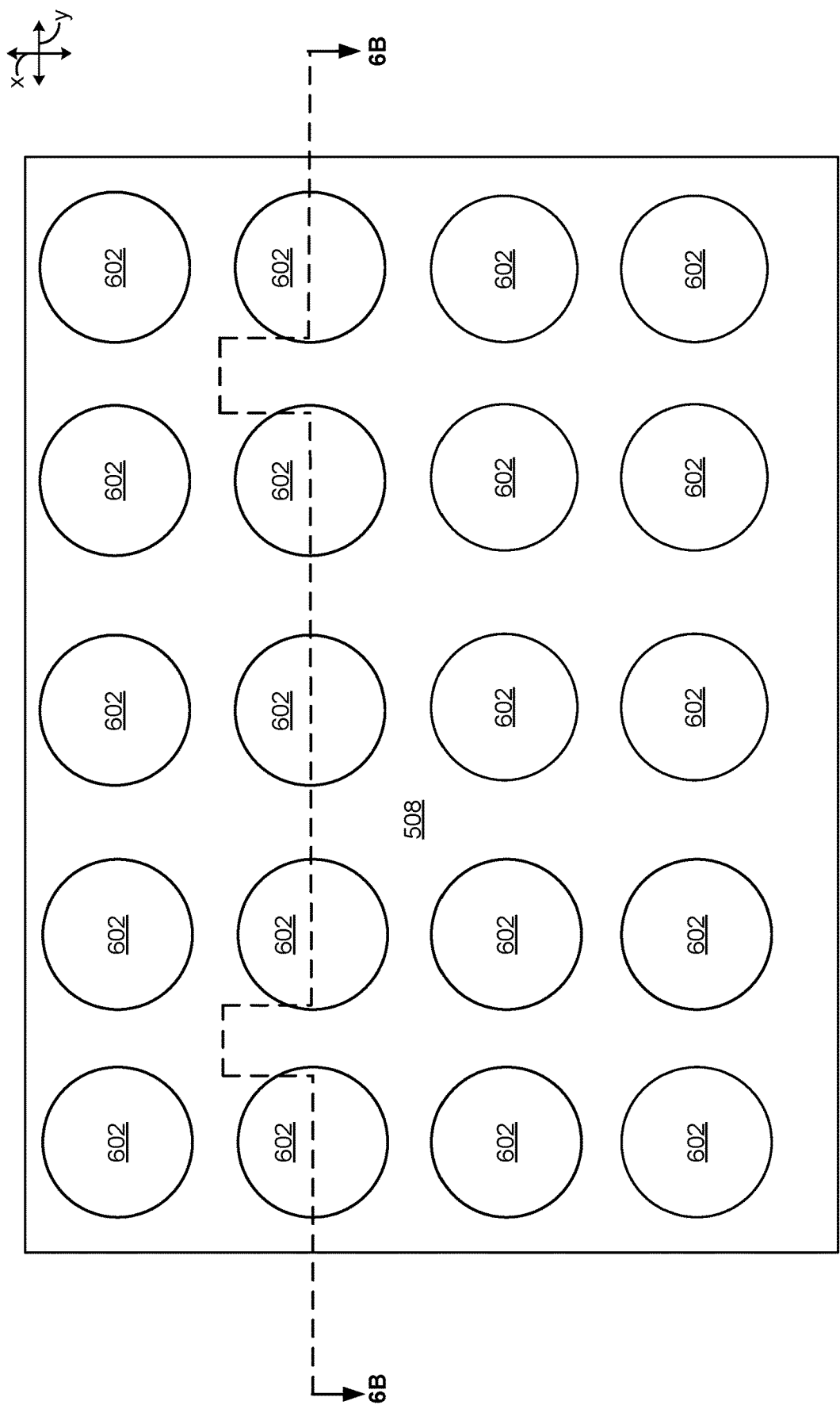
FIGS. 6A and 6B are diagrammatic views showing formation of the structure of FIGS. 3A-3E at an example process stage that is after the example process stage of FIGS. 5A and 5B.
Figure 6B:
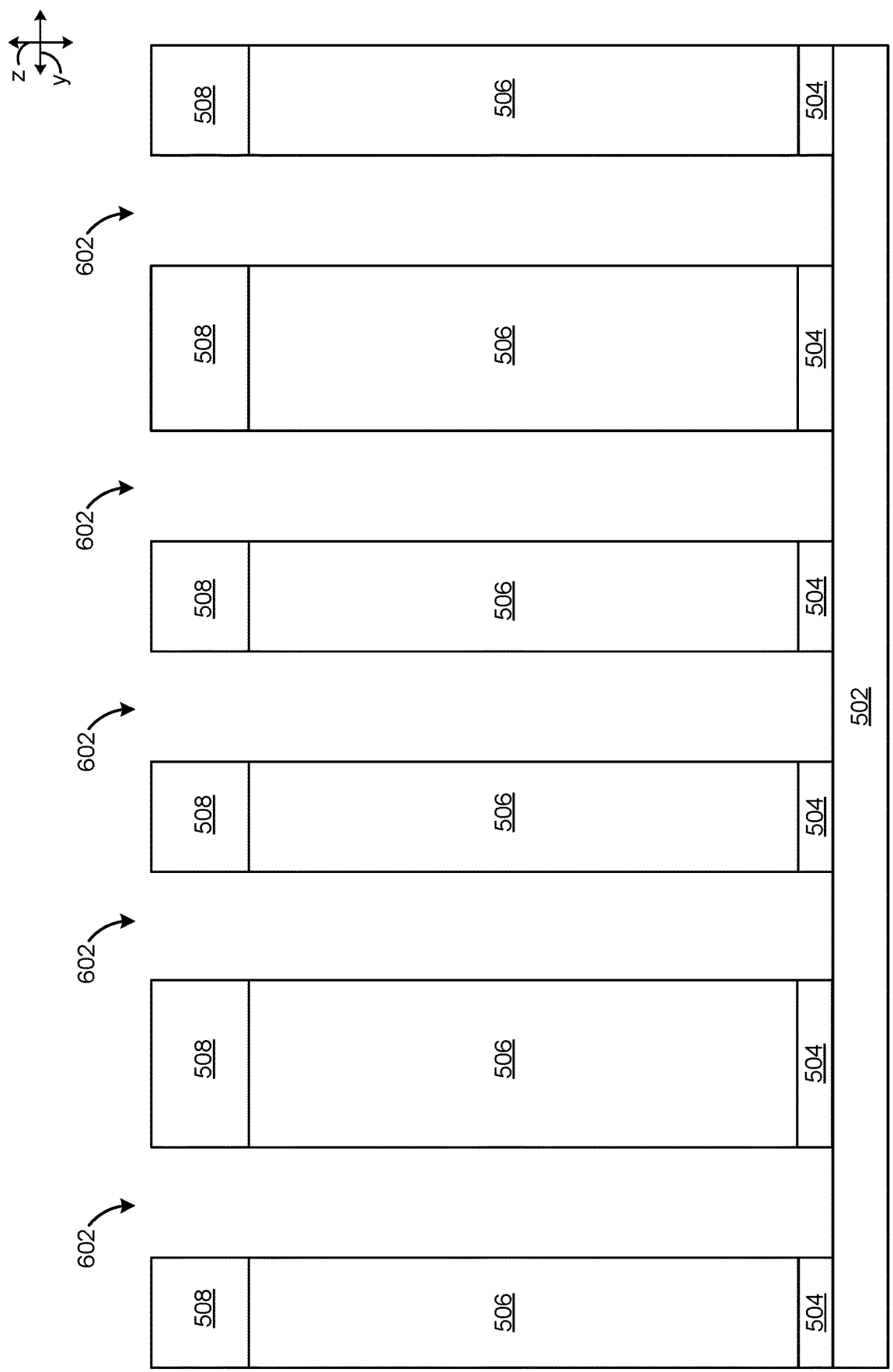

As shown in FIGS. 6A-6B, the process may include removing (e.g., etching) material to form voids 602. The removed material may include insulative material 504, insulative material 506, and insulative material 508. Thus, the removal may be a full stack removal (e.g., a full stack etch) to remove all material in the voids 602 except for the substrate 322. As shown, a shape of the voids 602 may be a cylinder. A mask may be used to cover a portion of the structure, and material may be removed (e.g., etched) from unmasked regions to form the voids 602. This step may form pillars of insulative material 504, insulative material 506, and insulative material 508 along the illustrated cross-section of FIG. 6B. Each of these pillars may have substantially the same dimensions.

Figure 7B:
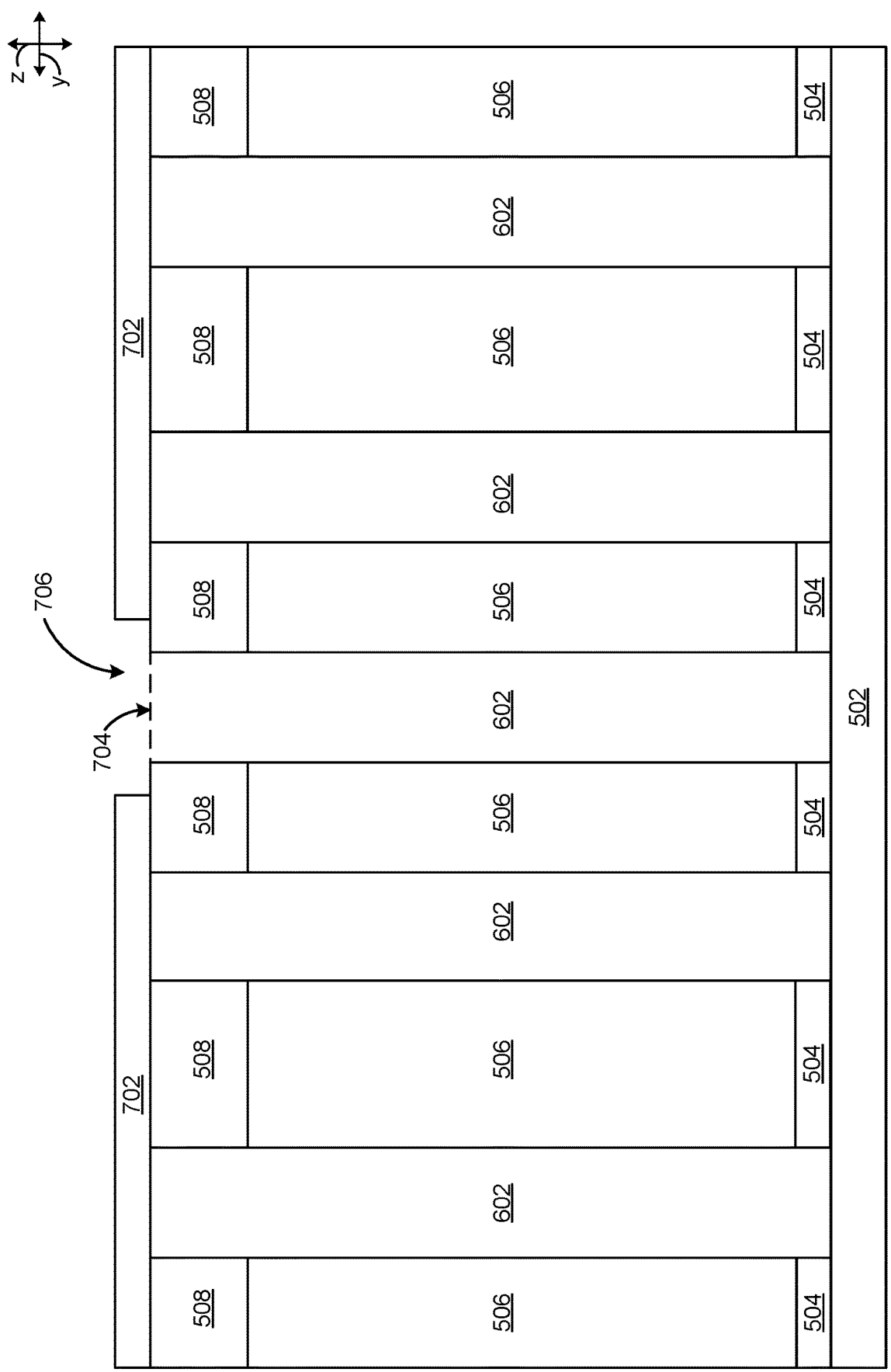

As shown in FIGS. 7A-7B, the process may include forming (e.g., depositing or growing) a mask 702 along a horizontal surface 704 that is substantially horizontally aligned with the top surfaces of the insulative material 508 (e.g., the top surfaces of pillars with the insulative material 508 on top). The mask 702 may comprise, consist of, or consist essentially of carbon (or another hard mask), among other examples. In some implementations, the mask 702 may be applied using a spin-on carbon technique. As further shown, the process may include removing (e.g., etching) material from the mask 702 to form an unmasked trench region 706. In some implementations, the width of the unmasked trench region 706 (e.g., along the y-axis) may be approximately equal to the pitch of the structure 300.

Figure 8B:
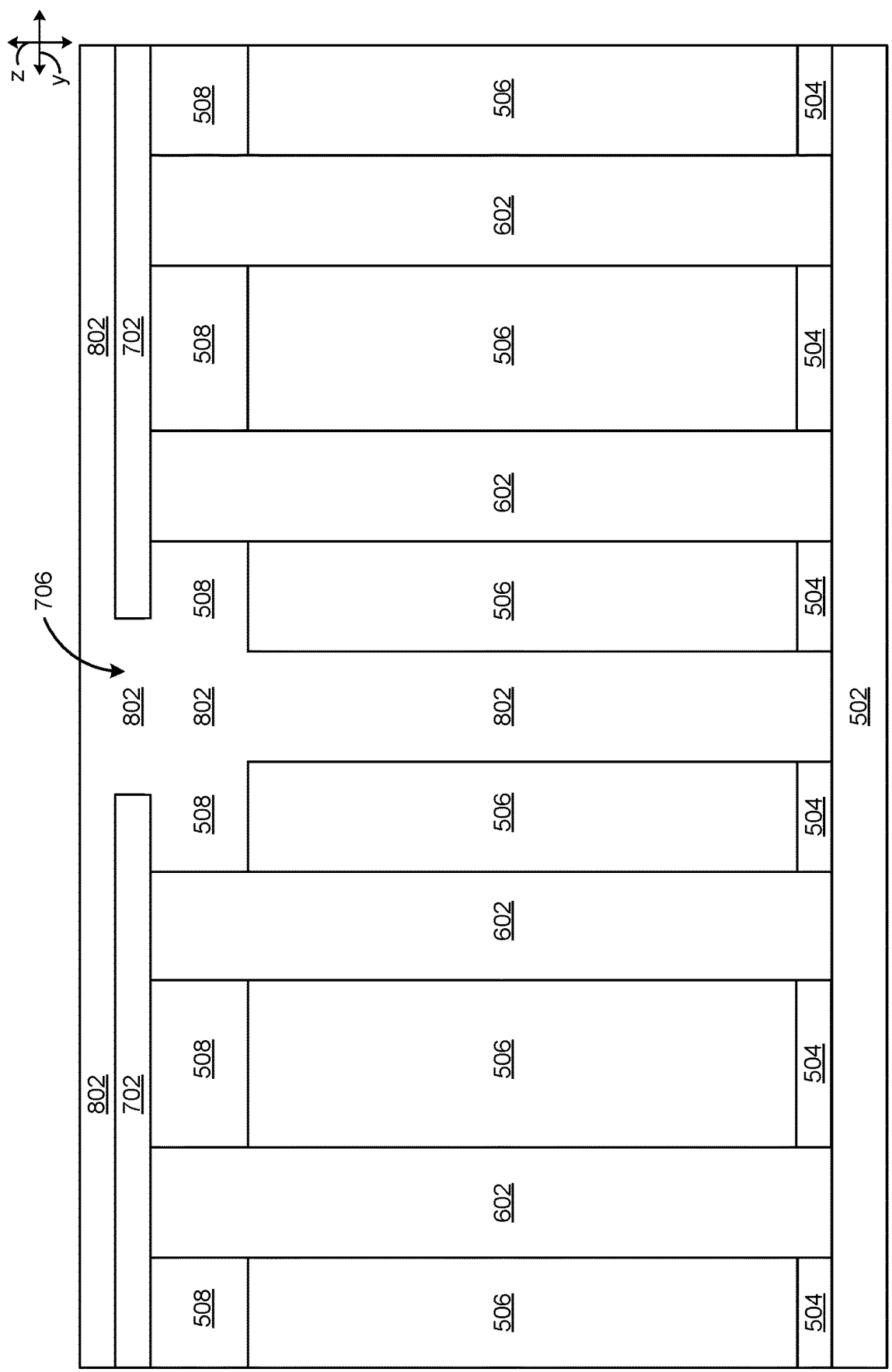

As shown in FIGS. 8A-8B, the process may include filling (e.g., depositing or growing) voids 602, that are unmasked as a result of forming the unmasked trench region 706, with insulative material 802. As shown, masked voids (e.g., that are masked by the mask 702) are not filled with the insulative material 802. The insulative material 802 may form the separation structure 326 and may comprise, consist of, or consist essentially of one or more of the materials described above in connection with the separation structure 326. As shown, the insulative material 802 may be deposited on the electrically conductive material 502 in a void 602 between pillars, may fill the unmasked trench region 706 between the mask 702, and may be deposited on the mask 702.

As shown in FIGS. 9A-9B, the process may include removing (e.g., etching) the mask 702 (e.g., an entirety of the mask 702) and removing (e.g., etching) a portion of the insulative material 802 down to the horizontal surface 704. In some implementations, the process may include planarizing the horizontal surface 704 of the integrated assembly. For example, the horizontal surface 704 may be planarized using chemical-mechanical polishing or another suitable planarization technique.

Figure 10B:
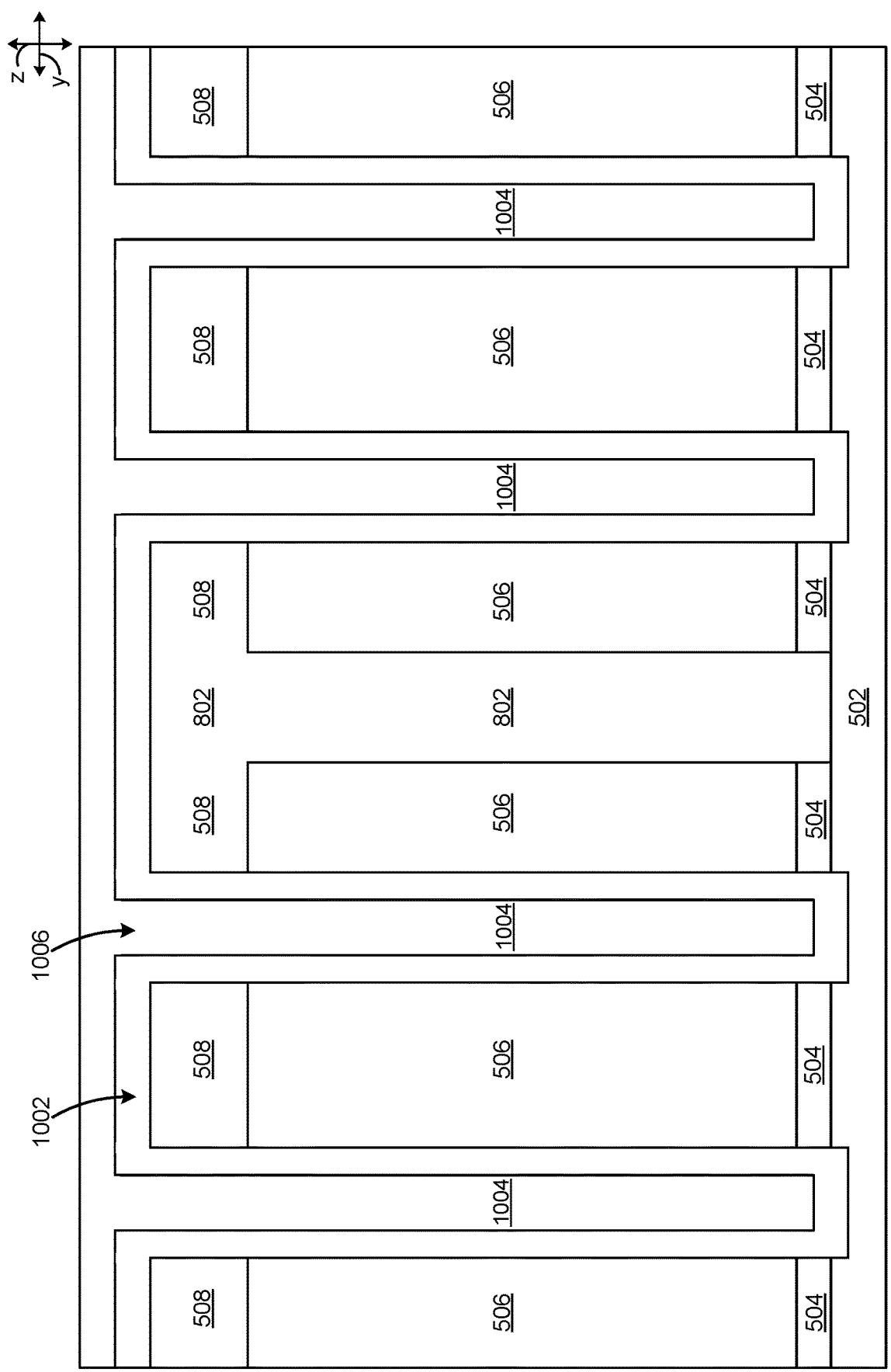

As shown in FIGS. 10A-10B, the process may include forming (e.g., depositing or growing) electrically conductive material 1002 on the electrically conductive material 502, the insulative material 504, the insulative material 506, the insulative material 508, and the insulative material 802. For example, the electrically conductive material 1002 may be formed in the remaining (unmasked) voids 602 along surfaces of materials that are exposed to those voids 602. The electrically conductive material 1002 may be formed such that a void 1004 is formed in a region contained by a shape of the electrically conductive material 1002. The electrically conductive material 1002 may form the bottom electrodes 308 and may comprise, consist of, or consist essentially of one or more of the materials described above in connection with the bottom electrode 308.

As shown in FIGS. 10A-OB, the process may include forming (e.g., depositing or growing) material 1006 on the electrically conductive material 1002. For example, the material 1006 may be formed in the voids 1004. The material 1006 may form support pillars 306 and may comprise, consist of, or consist essentially of one or more of the materials described above in connection with the support pillar 306.

Figure 11A:
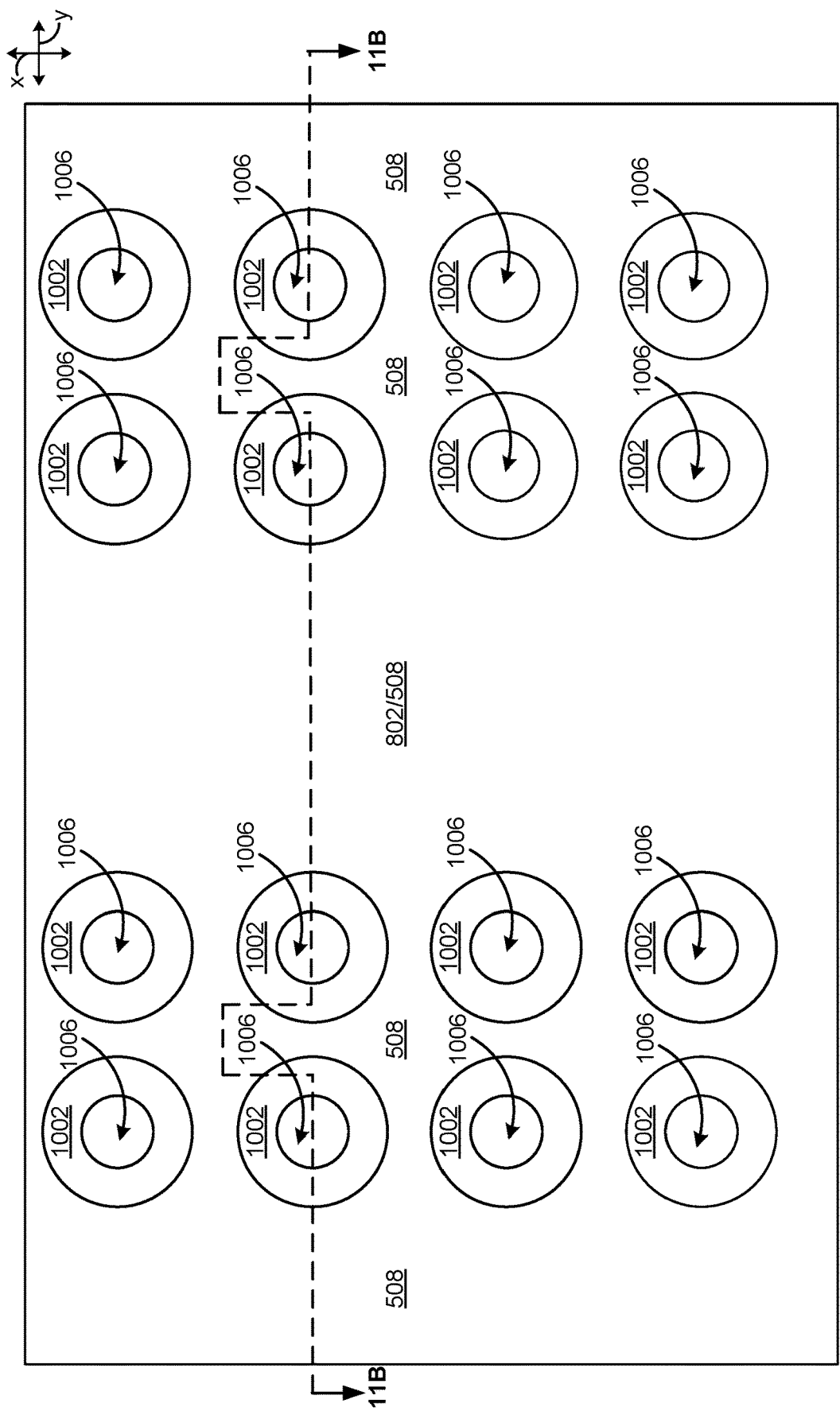

As shown in FIGS. 11A-11B, the process may include removing (e.g., etching) a portion of the electrically conductive material 1002 and a portion of the material 1006 to form recessed regions 1102. In some implementations, the depth of the recessed regions along the z-axis (e.g., measured down from the horizontal surface 704) may be approximately equal to 40 nanometers. In some implementations, the process may include planarizing the horizontal surface 704 (e.g., using chemical-mechanical polishing or another suitable planarization technique) and removing (e.g., etching) electrically conductive material 1002 and material 1006 between pillars of insulative material.

As shown in FIGS. 12A-12B, the process may include forming (e.g., depositing or growing) electrically conductive material 1202 on the electrically conductive material 1002, the material 1006, the insulative material 508, and the insulative material 802. For example, the electrically conductive material 1202 may be formed in the recessed regions 1102. The electrically conductive material 1202 may be formed such that a void 1204 is formed in a region contained by a shape of the electrically conductive material 1202. The electrically conductive material 1202 may form the leaker devices 316 and may comprise, consist of, or consist essentially of one or more of the materials described above in connection with the leaker device 316.

As shown in FIGS. 12A-12B, the process may include forming (e.g., depositing or growing) material 1206 on the electrically conductive material 1202. For example, the material 1206 may be formed in the voids 1204. The material 1206 may form the support material 320 and may comprise, consist of, or consist essentially of one or more of the materials described above in connection with the support material 320. In some implementations, the material 1206 has a higher etch resistivity than the insulative material 506 so that the material 1206 is maintained after the exhume process described below in connection with FIG. 14B.

In some implementations, depending on a desired configuration and/or resistance of the leaker device 316, the process step of forming the material 1206 may be omitted. In this case, the electrically conductive material 1202 may fill the recessed regions 1102 (e.g., rather than the recessed regions 1102 being filled with both the electrically conductive material 1202 and the material 1206).

Figure 13A:
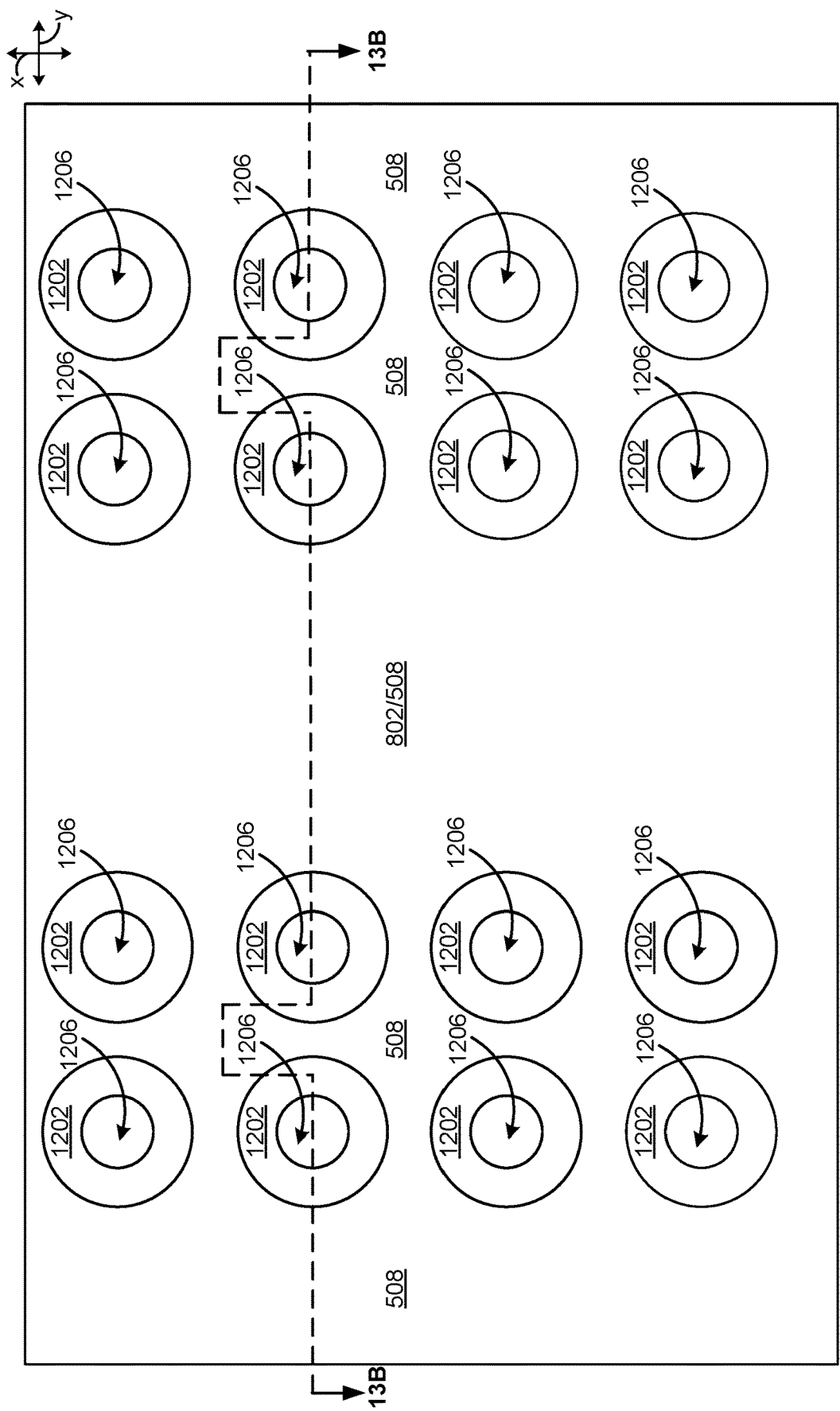
FIGS. 13A and 13B are diagrammatic views showing formation of the structure of FIGS. 3A-3E at an example process stage that is after the example process stage of FIGS. 12A and 12B.
Figure 13B:
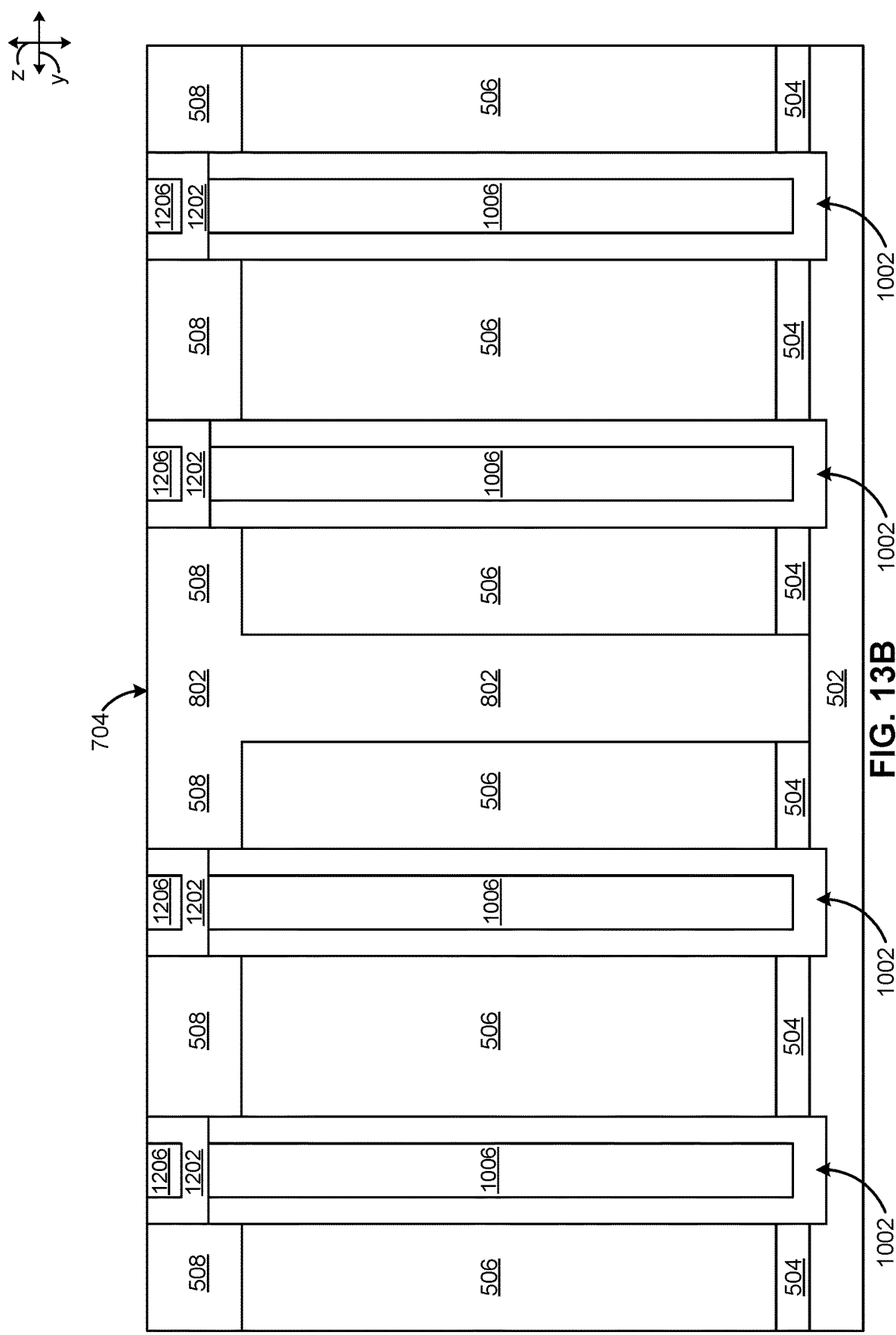

As shown in FIGS. 13A-13B, the process may include removing (e.g., etching) a portion of the electrically conductive material 1202 and/or removing (e.g., etching) a portion of the material 1206 down to the horizontal surface 704. In some implementations, the process may include planarizing the horizontal surface 704 of the integrated assembly. For example, the horizontal surface 704 may be planarized using chemical-mechanical polishing or another suitable planarization technique.

Figure 14A:
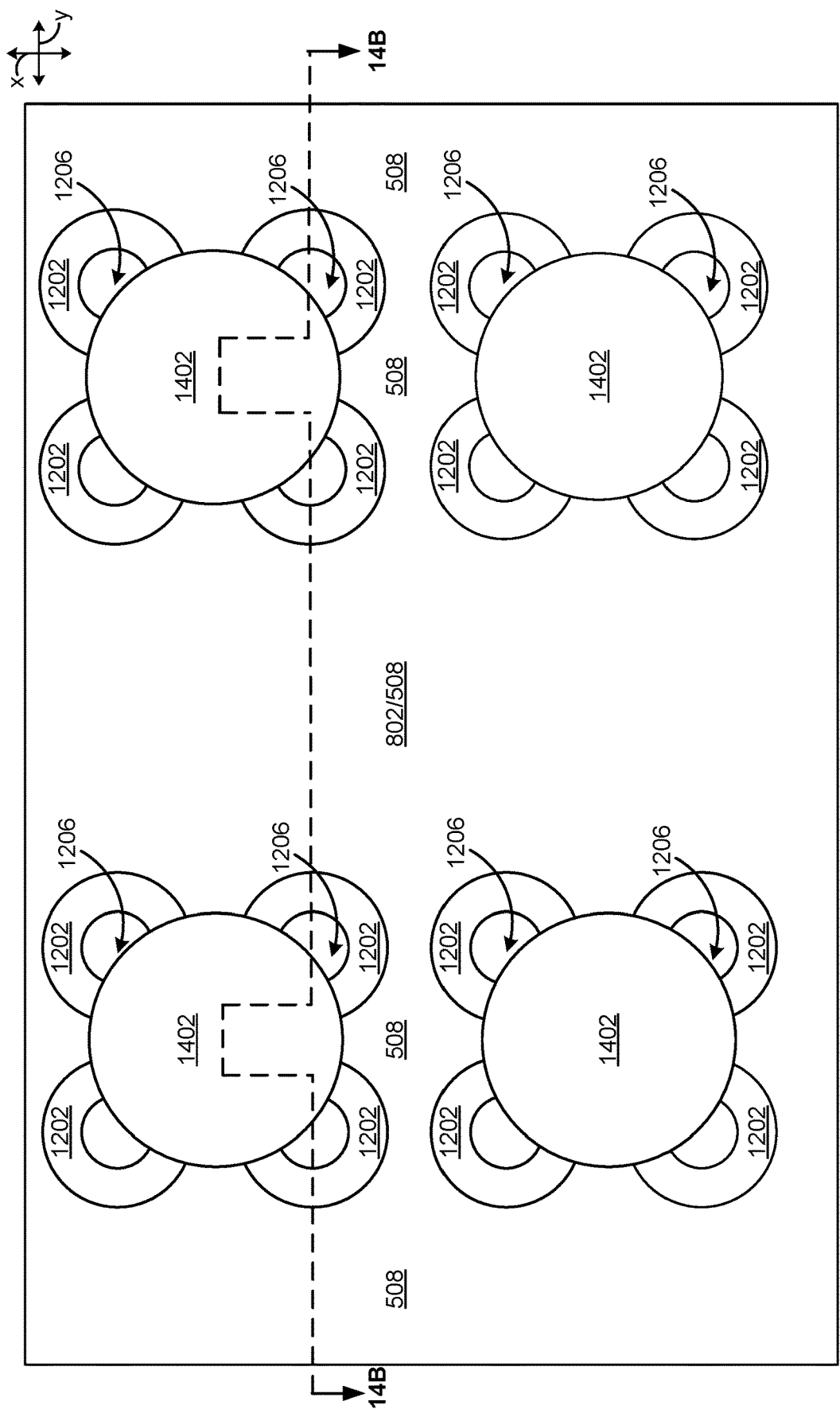
FIGS. 14A and 14B are diagrammatic views showing formation of the structure of FIGS. 3A-3E at an example process stage that is after the example process stage of FIGS. 13A and 13B.
Figure 14B:
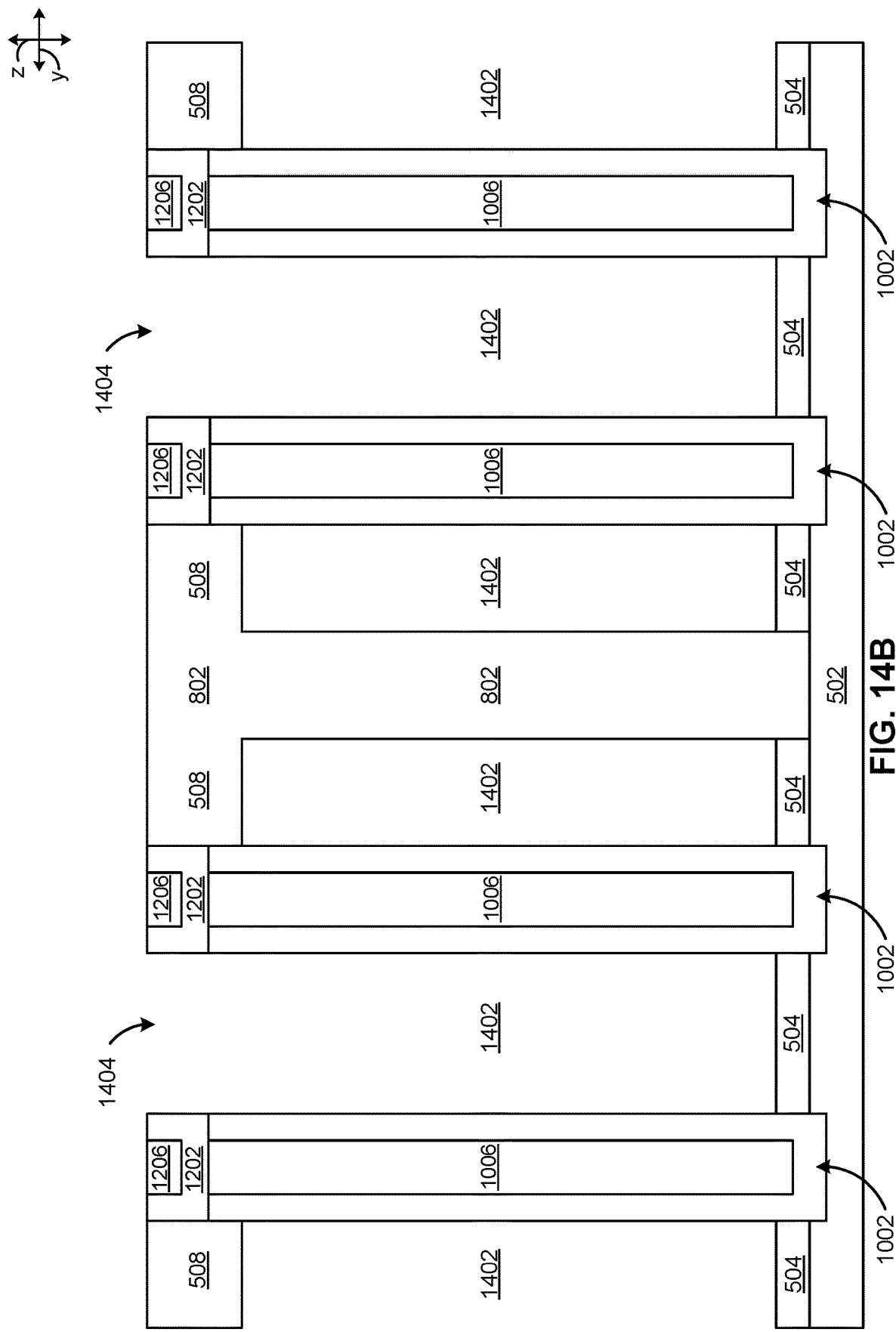

As shown in FIGS. 14A-14B, the process may include removing (e.g., etching) material to form voids 1402. The removed material may include the insulative material 506 and a portion of the insulative material 508. In some implementations, a mask may be used to cover a portion of the structure, and insulative material 508 may be removed (e.g., etched) from unmasked regions to form openings 1404, such as by using a patterning and etching process. The insulative material 506 may then be exhumed, such as by using a wet etching process that selectively removes the insulative material 506 (e.g., an oxide) and leaves other illustrated material intact (e.g., metals and nitrides).

Figure 15B:
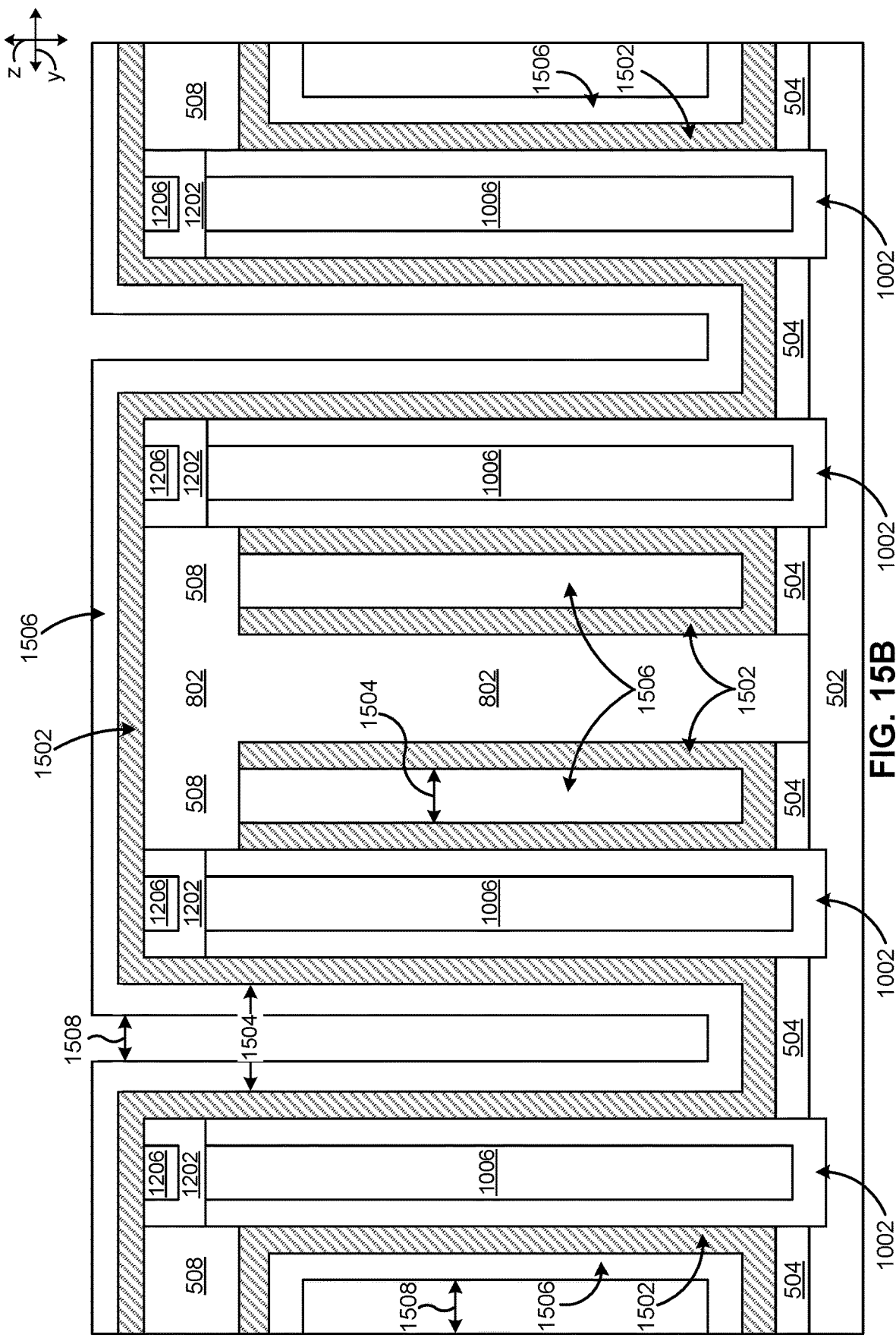

As shown in FIGS. 15A-15B, the process may include forming (e.g., depositing or growing) insulative material 1502 on the insulative material 504, the electrically conductive material 1002, the electrically conductive material 1202, the material 1206, the insulative material 508, and the insulative material 802. For example, the insulative material 1502 may be formed in the voids 1402 along surfaces of materials that are exposed to the voids 1402. The insulative material 1502 may be formed such that a void 1504 is formed in a region contained by a shape of the insulative material 1502. The insulative material 1502 may form the insulator 310 and may comprise, consist of, or consist essentially of one or more of the materials described above in connection with the insulator 310.

As shown in FIGS. 15A-15B, the process may include forming (e.g., depositing or growing) electrically conductive material 1506 on the insulative material 1502. For example, the electrically conductive material 1506 may be formed in the voids 1504. The electrically conductive material 1506 may be formed such that a void 1508 is formed in a region contained by a shape of the electrically conductive material 1506.

The electrically conductive material 1506 may form top electrodes 312 and may comprise, consist of, or consist essentially of one or more of the materials described above in connection with the top electrode 312.

Figure 16A:
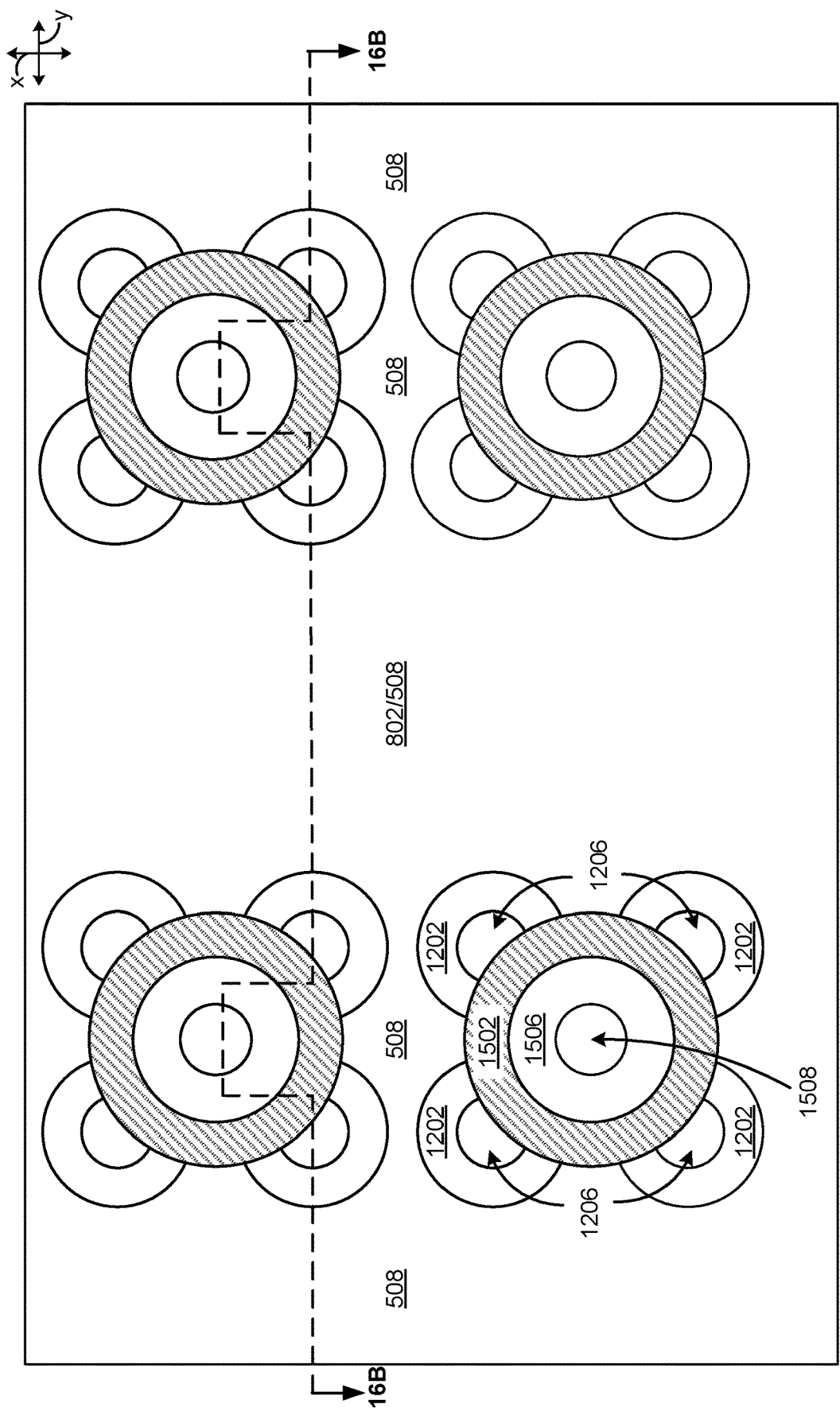
FIGS. 16A and 16B are diagrammatic views showing formation of the structure of FIGS. 3A-3E at an example process stage that is after the example process stage of FIGS. 15A and 15B.
Figure 16B:
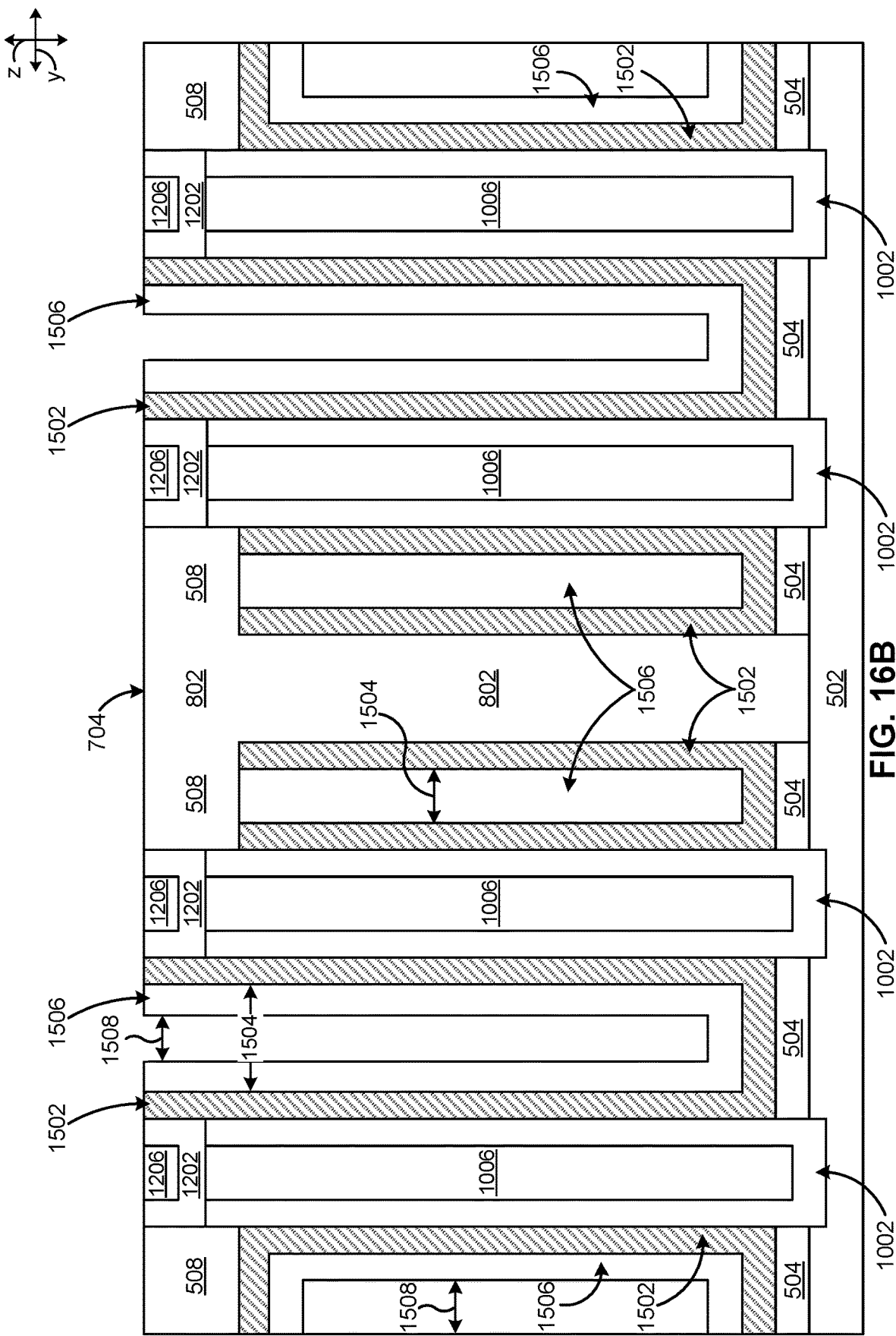

As shown in FIGS. 16A-16B, the process may include removing (e.g., etching) a portion of the insulative material 1502 and/or removing (e.g., etching) a portion of the electrically conductive material 1506 down to the horizontal surface 704. In some implementations, the process may include planarizing the horizontal surface 704 of the integrated assembly. For example, the horizontal surface 704 may be planarized using chemical-mechanical polishing or another suitable planarization technique.

Figure 17B:
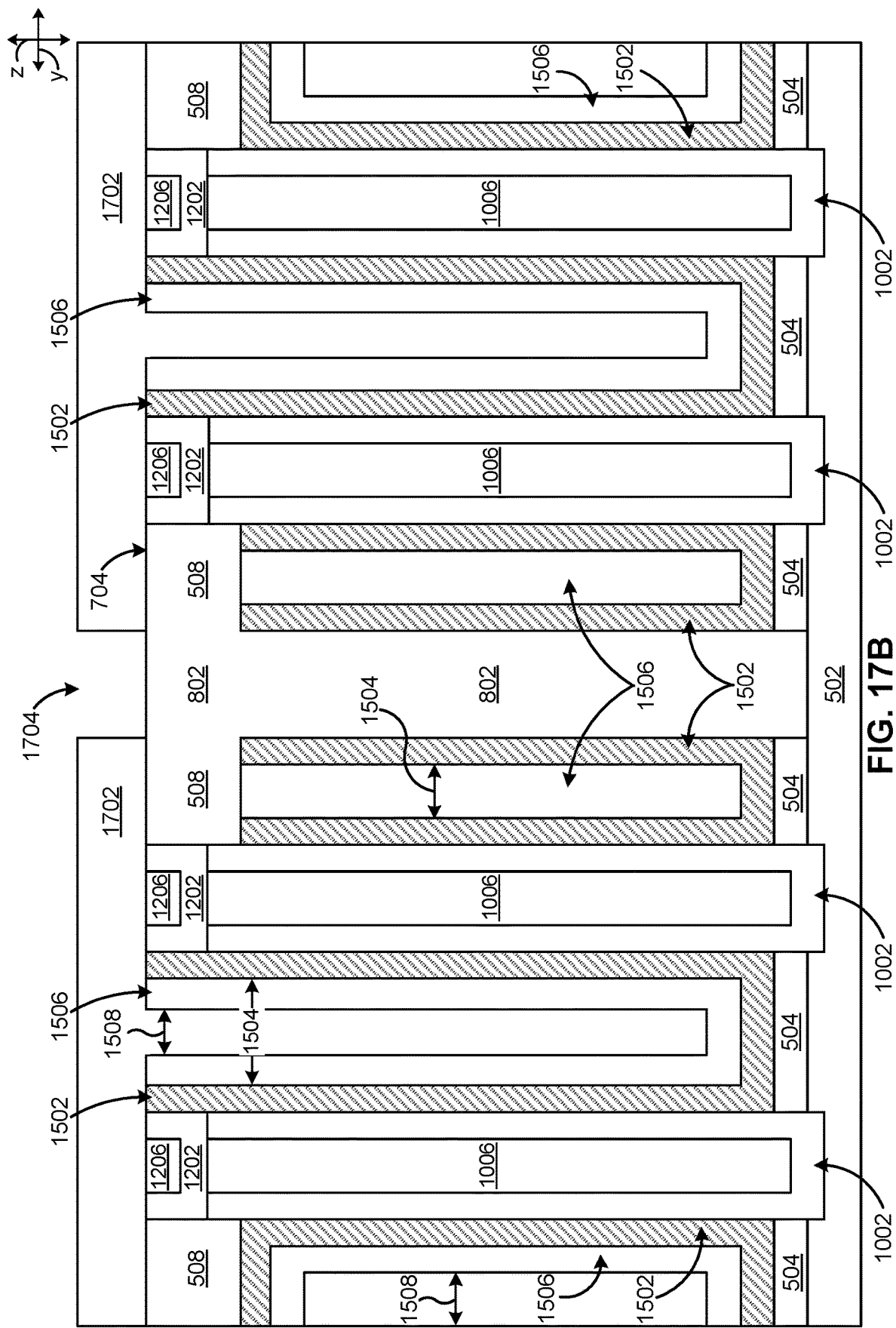

As shown in FIGS. 17A-17B, the process may include forming (e.g., depositing or growing) electrically conductive material 1702 on the insulative material 508, the electrically conductive material 1202, the material 1206, the insulative material 1502, the electrically conductive material 1506, and the insulative material 802. For example, the electrically conductive material 1702 may be formed in the voids 1508 (e.g., to fill the voids 1508) and along and abutting the horizontal surface 704. The electrically conductive material 1702 may form the conductive plates 328 and may comprise, consist of, or consist essentially of one or more of the materials described above in connection with the conductive plate 328.

As shown in FIGS. 17A-17B, the process may include removing (e.g., etching) a portion of the electrically conductive material 1702 to form a gap 1704. The gap 1704 may remove all of the electrically conductive material 1702, along a trench, down to the insulative material 508 and/or the insulative material 802 (e.g., down to the horizontal surface 704).

As indicated above, the process steps described in connection with FIGS. 5A-5B through FIGS. 17A-17B are provided as examples. Other examples may differ from what is described with respect to FIGS. 5A-5B through FIGS. 17A-17B. The structure shown in FIGS. 17A-17B may be equivalent to the structure 300 described elsewhere herein. In process steps above that describe forming material, such material may be formed, for example, using chemical vapor deposition, atomic layer deposition, physical vapor deposition, or another deposition technique. In process steps above that describe removing material, such material may be removed, for example, using a wet etching technique (e.g., wet chemical etching), a dry etching technique (e.g., plasma etching), an ion etching technique (e.g., sputtering or reactive ion etching), atomic layer etching, or another etching technique.

Figure 18:
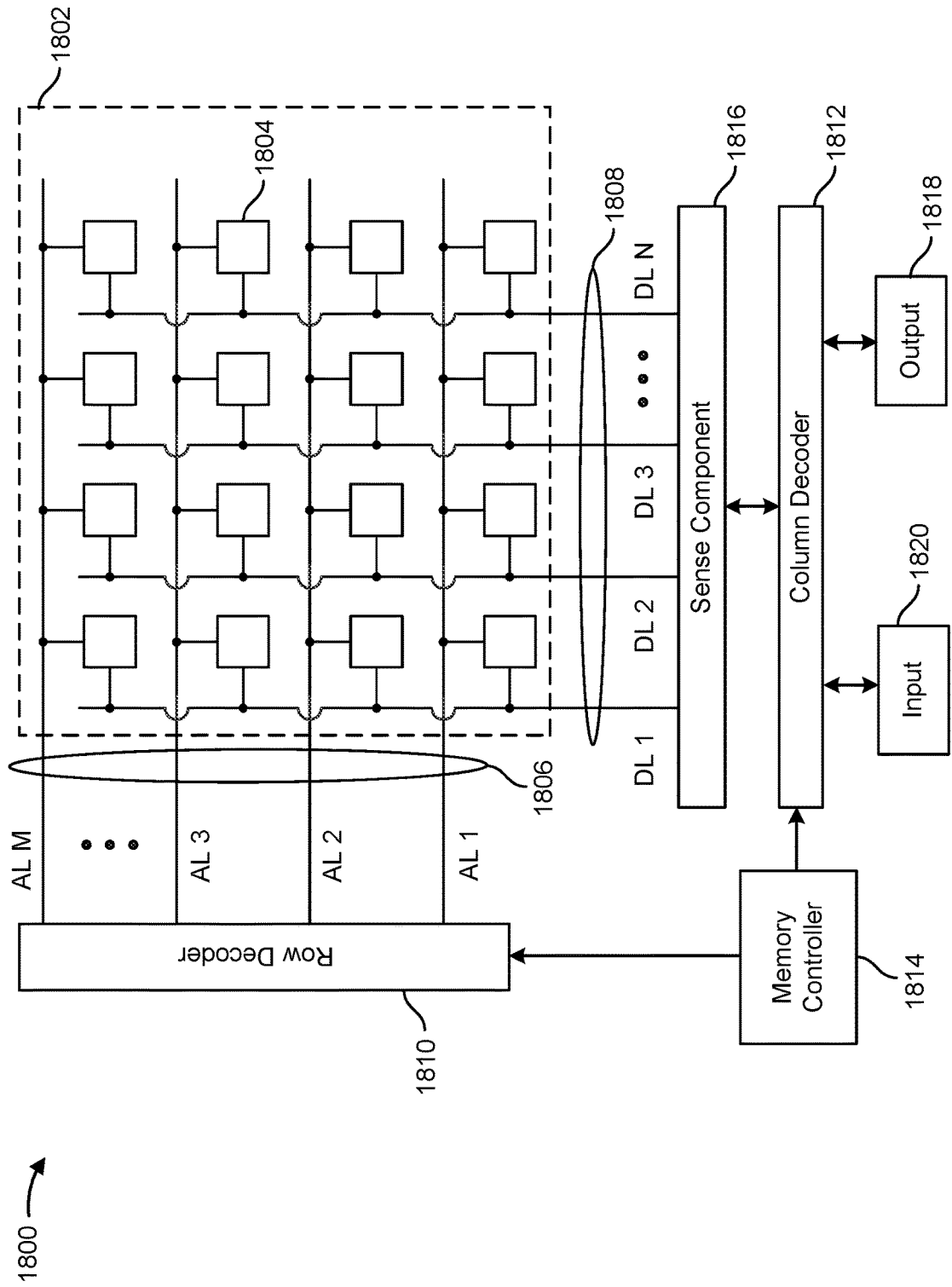
FIG. 18 is a diagrammatic view of an example memory device.

FIG. 18 is a diagrammatic view of an example memory device 1800. The memory device 1800 may include a memory array 1802 that includes multiple memory cells 1804. A memory cell 1804 is programmable or configurable into a data state of multiple data states (e.g., two or more data states). For example, a memory cell 1804 may be set to a particular data state at a particular time, and the memory cell 1804 may be set to another data state at another time. A data state may correspond to a value stored by the memory cell 1804. The value may be a binary value, such as a binary 0 or a binary 1, or may be a fractional value, such as 0.5, 1.5, or the like. A memory cell 1804 may include a capacitor to store a charge representative of the data state. For example, a charged and an uncharged capacitor may represent a first data state and a second data state, respectively. As another example, a first level of charge (e.g., fully charged) may represent a first data state, a second level of charge (e.g., fully discharged) may represent a second data state, a third level of charge (e.g., partially charged) may represent a third data state, and so on.

Operations such as reading and writing (i.e., cycling) may be performed on memory cells 1804 by activating or selecting the appropriate access line 1806 (shown as access lines AL 1 through AL M) and digit line 1808 (shown as digit lines DL 1 through DL N). An access line 1806 may also be referred to as a "row line" or a "word line," and a digit line 1808 may also be referred to a "column line" or a "bit line." Activating or selecting an access line 1806 or a digit line 1808 may include applying a voltage to the respective line. An access line 1806 and/or a digit line 1808 may comprise, consist of, or consist essentially of a conductive material, such as a metal (e.g., copper, aluminum, gold, titanium, or tungsten) and/or a metal alloy, among other examples. In FIG. 18, each row of memory cells 1804 is connected to a single access line 1806, and each column of memory cells 1804 is connected to a single digit line 1808. By activating one access line 1806 and one digit line 1808 (e.g., applying a voltage to the access line 1806 and digit line 1808), a single memory cell 1804 may be accessed at (e.g., is accessible via) the intersection of the access line 1806 and the digit line 1808. The intersection of the access line 1806 and the digit line 1808 may be called an "address" of a memory cell 1804.

In some implementations, the logic storing device of a memory cell 1804, such as a capacitor, may be electrically isolated from a corresponding digit line 1808 by a selection component, such as a transistor. The access line 1806 may be connected to and may control the selection component. For example, the selection component may be a transistor, and the access line 1806 may be connected to the gate of the transistor. Activating the access line 1806 results in an electrical connection or closed circuit between the capacitor of a memory cell 1804 and a corresponding digit line 1808. The digit line 1808 may then be accessed (e.g., is accessible) to either read from or write to the memory cell 1804.

A row decoder 1810 and a column decoder 1812 may control access to memory cells 1804. For example, the row decoder 1810 may receive a row address from a memory controller 1814 and may activate the appropriate access line 1806 based on the received row address. Similarly, the column decoder 1812 may receive a column address from the memory controller 1814 and may activate the appropriate digit line 1808 based on the column address.

Upon accessing a memory cell 1804, the memory cell 1804 may be read (e.g., sensed) by a sense component 1816 to determine the stored data state of the memory cell 1804. For example, after accessing the memory cell 1804, the capacitor of the memory cell 1804 may discharge onto its corresponding digit line 1808. Discharging the capacitor may be based on biasing, or applying a voltage, to the capacitor. The discharging may induce a change in the voltage of the digit line 1808, which the sense component 1816 may compare to a reference voltage (not shown) to determine the stored data state of the memory cell 1804. For example, if the digit line 1808 has a higher voltage than the reference voltage, then the sense component 1816 may determine that the stored data state of the memory cell 1804 corresponds to a first value, such as a binary 1. Conversely, if the digit line 1808 has a lower voltage than the reference voltage, then the sense component 1816 may determine that the stored data state of the memory cell 1804 corresponds to a second value, such as a binary 0. The detected data state of the memory cell 1804 may then be output (e.g., via the column decoder 1812) to an output component 1818 (e.g., a data buffer). A memory cell 1804 may be written (e.g., set) by activating the appropriate access line 1806 and digit line 1808. The column decoder 1812 may receive data, such as input from input component 1820, to be written to one or more memory cells 1804. A memory cell 1804 may be written by applying a voltage across the capacitor of the memory cell 1804.

The memory controller 1814 may control the operation (e.g., read, write, re-write, refresh, and/or recovery) of the memory cells 1804 via the row decoder 1810, the column decoder 1812, and/or the sense component 1816. The memory controller 1814 may generate row address signals and column address signals to activate the desired access line 1806 and digit line 1808. The memory controller 1814 may also generate and control various voltages used during the operation of the memory array 1802.

In some implementations, the memory device 1800 includes the structure 300 and/or an integrated assembly that includes the structure 300. For example, the memory array 1802 may include the structure 300 and/or an integrated assembly that includes the structure 300. Additionally, or alternatively, the memory cell 1804 may include a memory cell described elsewhere herein.

As indicated above, FIG. 18 is provided as an example. Other examples may differ from what is described with respect to FIG. 18.

In some implementations, an integrated assembly includes a support pillar having a top surface, a bottom surface, and a circumferential surface; a first electrode having: a top surface, an interior circumferential surface along and abutting the circumferential surface of the support pillar, an exterior circumferential surface, and a bottom surface that is below the bottom surface of the support pillar; a leaker device having: a bottom surface that abuts the top surface of the first electrode and the top surface of the support pillar, and an exterior circumferential surface that is substantially vertically aligned with the exterior circumferential surface of the first electrode; an insulator having: a first vertical surface along and abutting the exterior circumferential surface of the first electrode and the exterior circumferential surface of the leaker device, and a second vertical surface; a second electrode having: a first vertical surface along and abutting the second vertical surface of the insulator, and a second vertical surface; and a conductive plate that couples the second electrode with a plurality of other second electrodes that are substantially similar to the second electrode, wherein the leaker device couples the first electrode to the conductive plate and is configured to discharge excess charge from the first electrode to the conductive plate.

In some implementations, a memory device includes a plurality of memory cells that each include: a bottom electrode having an open top cylinder shape that contains a support pillar; a top electrode; an insulator that separates the top electrode from the bottom electrode; and a leaker device having an open top cylinder shape, wherein a bottom surface of the leaker device abuts at least one of a top surface of the bottom electrode or a top surface of the support pillar, and wherein a top surface of the leaker device abuts a bottom surface of a conductive plate; and the conductive plate.

In some implementations, a method includes forming a bottom electrode having an open top cylinder shape; forming a support pillar, contained within the open top cylinder shape of the bottom electrode, that has a cylinder shape; forming a leaker device having an open top cylinder shape and a bottom surface that abuts and does not extend vertically below a top surface of the support pillar; forming an insulator having a first vertical surface and a second vertical surface, wherein the first vertical surface of the insulator is in contact with the bottom electrode; forming a top electrode having a first vertical surface and a second vertical surface, wherein the first vertical surface of the top electrode is in contact with the second vertical surface of the insulator, and wherein the insulator separates the top electrode from the bottom electrode; and forming conductive material that contacts the leaker device and the second vertical surface of the top electrode.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An integrated assembly, comprising:
   a support pillar having a top surface, a bottom surface, and a circumferential surface;
   a first electrode having:
      a top surface,
      an interior circumferential surface along and abutting the circumferential surface of the support pillar,
      an exterior circumferential surface, and
      a bottom surface that is below the bottom surface of the support pillar;
   a leaker device having:
      a bottom surface that abuts the top surface of the first electrode and the top surface of the support pillar, and
      an exterior circumferential surface that is substantially vertically aligned with the exterior circumferential surface of the first electrode;
   an insulator having:
      a first vertical surface along and abutting the exterior circumferential surface of the first electrode and the exterior circumferential surface of the leaker device, and
      a second vertical surface;
   a second electrode having:
      a first vertical surface along and abutting the second vertical surface of the insulator, and
      a second vertical surface; and
   a conductive plate that couples the second electrode with a plurality of other second electrodes that are substantially similar to the second electrode,
      wherein the leaker device couples the first electrode to the conductive plate and is configured to discharge excess charge from the first electrode to the conductive plate.

2. The integrated assembly of claim 1, wherein the bottom surface of the leaker device does not extend vertically below the top surface of the support pillar.

3. The integrated assembly of claim 1, wherein the top surface of the first electrode is substantially horizontally aligned with the top surface of the support pillar.

4. The integrated assembly of claim 1, wherein the leaker device has a top surface and an interior circumferential surface; and
wherein the integrated assembly further comprises support material abutting the interior circumferential surface of the leaker device, wherein the support material has a top surface that is substantially horizontally aligned with the top surface of the leaker device.

5. The integrated assembly of claim 1, wherein a top surface of the insulator is vertically higher than the top surface of the first electrode and the top surface of the support pillar, and wherein insulative material of the insulator is not above the first electrode and is not above the support pillar.

6. The integrated assembly of claim 1, wherein a top surface of the second electrode is vertically higher than the top surface of the first electrode and the top surface of the support pillar, and wherein conductive material of the second electrode is not above the first electrode and is not above the support pillar.

7. The integrated assembly of claim 1, wherein the conductive plate extends horizontally along a top surface of the leaker device and a top surface of the second electrode.

8. The integrated assembly of claim 1, wherein the conductive plate is a first conductive plate, and further comprising:
a second conductive plate that couples a group of second electrodes to one another, wherein the group of second electrodes does not include the second electrode or the plurality of other second electrodes.

9. The integrated assembly of claim 8, further comprising a separation structure that extends vertically from a substrate to a top surface of the separation structure,
wherein the top surface of the separation structure is substantially horizontally aligned with a bottom surface of the first conductive plate and a bottom surface of the second conductive plate,
wherein the separation structure includes a first horizontal extension and a second horizontal extension that extend horizontally in opposite directions from a top portion of the separation structure.

10. The integrated assembly of claim 9, wherein the first conductive plate abuts the first horizontal extension of the separation structure,
wherein the second conductive plate abuts the second horizontal extension of the separation structure, and
wherein a gap between the first conductive plate and the second conductive plate is above the top portion of the separation structure that is located between the first horizontal extension and the second horizontal extension.

11. The integrated assembly of claim 9, wherein insulative material of the insulator and conductive material of the second electrode are below the first horizontal extension and the second horizontal extension.

12. The integrated assembly of claim 1, wherein the second electrode is shared among a plurality of first electrodes, wherein the plurality of first electrodes includes the first electrode.

13. The integrated assembly of claim 1, wherein the insulator comprises ferroelectric material.

14. A memory device, comprising:
a conductive plate; and
a plurality of memory cells that each include:
a bottom electrode having an open top cylinder shape that contains a support pillar;
a top electrode that is shared among the plurality of memory cells;
an insulator that separates the top electrode from the bottom electrode; and
a leaker device having an open top cylinder shape,
wherein a bottom surface of the leaker device abuts at least one of a top surface of the bottom electrode or a top surface of the support pillar, and
wherein a top surface of the leaker device abuts a bottom surface of the conductive plate.

15. A memory device, comprising:
a conductive plate; and
a plurality of memory cells that each include:
a bottom electrode having an open top cylinder shape that contains a support pillar;
a top electrode;
an insulator that separates the top electrode from the bottom electrode; and
a leaker device having an open top cylinder shape,
wherein a bottom surface of the leaker device abuts at least one of a top surface of the bottom electrode or a top surface of the support pillar,
wherein the bottom surface of the leaker device does not extend vertically below the top surface of the support pillar, and
wherein a top surface of the leaker device abuts a bottom surface of the conductive plate.

16. The memory device of claim 14, wherein an exterior vertical surface of the leaker device is substantially vertically aligned with an exterior vertical surface of the bottom electrode.

17. The memory device of claim 14, wherein each memory cell, of the plurality of memory cells, includes a capacitor that includes the bottom electrode, the insulator, and the top electrode, and
wherein the top electrode is shared among a plurality of capacitors corresponding to the plurality of memory cells.

18. The memory device of claim 14, wherein the conductive plate comprises conductive material that contacts a plurality of leaker devices, corresponding to the plurality of memory cells, and that contacts the top electrode.

19. A memory device, comprising:
a conductive plate; and
a plurality of memory cells that each include:
a bottom electrode having an open top cylinder shape that contains a support pillar;
a top electrode, wherein the conductive plate comprises conductive material that contacts:
a plurality of leaker devices, corresponding to the plurality of memory cells, and
a top surface of the top electrode and a vertical surface of the top electrode;
an insulator that separates the top electrode from the bottom electrode; and
a leaker device, of the plurality of leaker devices, having an open top cylinder shape,
wherein a bottom surface of the leaker device abuts at least one of a top surface of the bottom electrode or a top surface of the support pillar, and
wherein a top surface of the leaker device abuts a bottom surface of the conductive plate.

20. The memory device of claim 18, wherein the conductive plate is a first conductive plate, the plurality of leaker devices is a first plurality of leaker devices, the plurality of memory cells is a first plurality of memory cells, the top electrode is a first top electrode, and further comprising:

a second conductive plate that contacts a second plurality of leaker devices, corresponding to a second plurality of memory cells included in the memory device, and that contacts a second top electrode shared among the second plurality of memory cells.

21. The memory device of claim 20, wherein the second conductive plate is separated from the first conductive plate by a gap.

22. An apparatus, comprising:
a conductive material; and
a plurality of memory cells that each include:
   a first electrode, around a pillar, that has a cylinder shape;
   a second electrode, coupled with the conductive material, that is shared among the plurality of memory cells; and
   a leaker device having a cylinder shape, wherein the leaker device is coupled with the first electrode and the conductive material.

23. The apparatus of claim 22, wherein the leaker device is in contact with and between the first electrode and the conductive material.

24. The apparatus of claim 22, wherein the second electrode is in contact with the conductive material, the apparatus further comprising:
   an insulator material in contact with and between the first electrode and the second electrode.

* * * * *